US 6,661,066 B2

(12) United States Patent
Kuroi et al.

(10) Patent No.: US 6,661,066 B2
(45) Date of Patent: Dec. 9, 2003

(54) SEMICONDUCTOR DEVICE INCLUDING INVERSELY TAPERED GATE ELECTRODE AND MANUFACTURING METHOD THEREOF

(75) Inventors: Takashi Kuroi, Tokyo (JP); Yasuyoshi Itoh, Tokyo (JP); Katsuyuki Horita, Tokyo (JP); Katsuomi Shiozawa, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/401,849

(22) Filed: Sep. 22, 1999

(65) Prior Publication Data
US 2002/0008293 A1 Jan. 24, 2002

(30) Foreign Application Priority Data

May 21, 1999  (JP) ......................................... P11-141271

(51) Int. Cl.$^7$ ............................................. H01L 31/119
(52) U.S. Cl. ...................... 257/412; 257/344; 257/365; 257/366; 257/413
(58) Field of Search ................................ 257/412, 313, 257/314, 315, 336, 349, 365, 316, 413

(56) References Cited

U.S. PATENT DOCUMENTS

| | | | |
|---|---|---|---|
| 5,508,534 A | | 4/1996 | Nakamura et al. |
| 5,578,522 A | | 11/1996 | Nakamura et al. |
| 5,600,168 A | * | 2/1997 | Lee ............................ 257/336 |
| 5,783,491 A | | 7/1998 | Nakamura et al. |
| 5,828,130 A | * | 10/1998 | Miller ......................... 257/754 |
| 5,834,816 A | * | 11/1998 | Jang ............................ 257/382 |
| 5,880,508 A | * | 3/1999 | Wu ............................. 257/411 |
| 6,025,635 A | * | 2/2000 | Krivokapic ................. 257/412 |
| 6,064,107 A | * | 5/2000 | Yeh et al. .................... 257/522 |
| 6,104,077 A | * | 8/2000 | Gardner et al. ............. 257/522 |
| 6,242,776 B1 | * | 6/2001 | Hause et al. ................ 257/344 |
| 6,515,338 B1 | * | 2/2003 | Inumiya et al. ............. 257/368 |

FOREIGN PATENT DOCUMENTS

| | | |
|---|---|---|
| JP | 7-99310 | 4/1995 |
| JP | 8-37296 | 2/1996 |
| JP | 10-135482 | 5/1998 |
| JP | 11-26756 | 1/1999 |
| JP | 11-74503 | 3/1999 |

OTHER PUBLICATIONS

Atsushi Yagishita, et al., "High Performance Metal Gate MOSFETs Fabricated by CMP for 0.1 $\mu$m Regime," International Electron Devices Meeting, (1998), pp. 785–788.

A. Chatterjee, et al., "CMOS Metal Replacement Gate Transistors using Tantalum Pentoxide Gate Insulator," International Electron Devices Meeting, (1998), pp. 777–780.

U.S. patent application Ser. No. 09/401,849, filed Sep. 22, 1999, pending.

U.S. patent application Ser. No. 09/543,349, filed Apr. 5, 2000, pending.

U.S. patent application Ser. No. 09/615,711, filed Jul. 13, 2000, pending.

* cited by examiner

Primary Examiner—Wael Fahmy
Assistant Examiner—Nathan W. Ha
(74) Attorney, Agent, or Firm—Oblon, Spivak, McClelland, Maier & Neustadt, P.C.

(57) ABSTRACT

A semiconductor device and manufacturing method including a MOSFET having a trench-type element isolation structure (2) formed on a main surface of a semiconductor substrate (1). A pair of extensions (3) and source/drain regions (4) are selectively formed in the main surface so as to face each other through a channel region (50), a silicon oxide film (5) is formed on the trench-type element isolation structure (2) and on the source/drain regions (4) through a silicon oxide film (12), sidewalls (6) are formed on sides of the silicon oxide film (5), a gate insulating film (7) is formed on the main surface in a part where the channel region (50) is formed and a gate electrode (8) is formed to fill a recessed portion in an inversely tapered shape formed by the sides of the sidewalls (6) and the upper surface of the gate insulating film (7).

2 Claims, 25 Drawing Sheets

SEMICONDUCTOR DEVICE INCLUDING INVERSELY TAPERED GATE ELECTRODE AND MANUFACTURING METHOD THEREOF

BACKGROUND OF THE INVENTION

1. Field of the Invention

The present invention relates to semiconductor devices and manufacturing methods thereof, and particularly to an MOSFET having a gate electrode formed of metal film and a manufacturing method thereof.

2. Description of the Background Art

Polycide gates having stacked structure of polysilicon film and metal silicide film are widely used as the gate electrodes of MOSFETs. However, formation of the gate electrodes with metal film, such as tungsten film, is effective to reduce the gate resistance so as to realize higher-speed operation of the MOSFETs.

When a gate electrode is formed of metal film, heat treatment after the formation of the gate electrode is restricted because of the low thermal resistance of the metal film and some other reasons. For example, the heat treatment to the source/drain regions which are usually formed after the formation of the gate electrode is restricted and the dopant is insufficiently activated, and then the source/drain resistance is increased to lower the driving capability of the MOSFET. To solve this inconvenience, a method of forming the source/drain regions before formation of the gate electrode is suggested, in which a dummy electrode is formed for the gate electrode (the replace method).

FIG. 36 is a sectional view showing the structure of an MOSFET having a gate electrode formed by a conventional replace method (Ext. Abst. of International Electron Devices Meeting 1998, pp.785–788). The conventional MOSFET shown in FIG. 36 has a semiconductor substrate 101, a trench-type element isolation structure 102 formed in the element isolation region in the main surface of the semiconductor substrate 101, a pair of source/drain regions 103 selectively formed in the element formation region in the main surface of the semiconductor substrate 101 to face each other through the channel region, a silicon oxide film 104 formed on the trench-type element isolation structure 102 and on the source/drain regions 103 through a silicon oxide film 108, a gate insulating film 105 formed on the main surface of the semiconductor substrate 101 in the part in which the silicon oxide film 104 is not formed in the element formation region, and a gate electrode 106 formed to fill the recessed portion formed by sides of the silicon oxide film 104 and the upper surface of the gate insulating film 105.

FIGS. 37 to 42 are sectional views showing a method for manufacturing the MOSFET shown in FIG. 36 in the order of process steps. First, the trench-type element isolation structure 102 filled with insulating film is formed in the element isolation region in the main surface of the semiconductor substrate 101 which is composed of single crystal silicon. Next, to form a well and to adjust the operation threshold voltage of the MOSFET, boron ions 107 are implanted into the semiconductor substrate 101 by an ion implantation (FIG. 37).

Next, the silicon oxide film 108 is formed by a thermal oxidation on the main surface of the semiconductor substrate 101. Subsequently, a polysilicon film and a silicon nitride film are formed in this order by CVD on the silicon oxide film 108. After this, the polysilicon film and the silicon nitride film are patterned into given shape by photolithography and anisotropic dry etching to selectively form a dummy electrode 150 on the silicon oxide film 108; the dummy electrode 150 has a stacked structure in which the polysilicon film 109 and the silicon nitride film 110 are stacked in this order (FIG. 38).

Next, arsenic ions 111 are implanted into the semiconductor substrate 101 by an ion implantation to form the source/drain regions 103 in the main surface of the semiconductor substrate 101 (FIG. 39). Subsequently, a thermal treatment is performed to activate the implanted arsenic ions 111. Next, a silicon oxide film is formed on the entire surface by a CVD. After that, the silicon oxide film is polished by CMP (Chemical Mechanical Polishing) until the upper surface of the dummy electrode 150 is exposed to form the silicon oxide film 104 (FIG. 40). Next, the dummy electrode 150 and the silicon oxide film 108 under the dummy electrode 150 are removed (FIG. 41). In FIG. 41, the silicon oxide films 104 and 108 serve as a mold for forming the gate electrode.

Next, the gate insulating film 105 composed of silicon oxide film is formed on the main surface of the semiconductor substrate 101 by a thermal oxidation. Subsequently, a tungsten film 113 is formed all over the surface by CVD or sputtering (FIG. 42). Next, by the CMP method, the tungsten film 113 is polished until the upper surface of the silicon oxide film 104 is exposed, thus providing the structure shown in FIG. 36.

FIG. 43 is a sectional view showing the structure of another MOSFET having a gate electrode formed by a conventional replace method. (Ext. Abst. of International Electron Devices Meeting 1998, pp.777–780). The conventional MOSFET shown in FIG. 43 has the semiconductor substrate 101 and the trench-type element isolation structure 102 which are the same as those in the MOSFET shown in FIG. 36, a pair of extensions 121 and source/drain regions 122 selectively formed in the element formation region in the main surface of the semiconductor substrate 101 to face each other with the channel region therebetween, a silicon oxide film 123 formed on the trench-type element isolation structure 102 and on the extensions 121 with a silicon oxide film 127 interposed therebetween, sidewalls 124 formed in sides of the silicon oxide film 123, a gate insulating film 125 formed on the main surface of the semiconductor substrate 101 in the part in which the silicon oxide film 123 and the sidewalls 124 are not formed in the element formation region, and a gate electrode 126 formed to fill the recessed part formed by the sides of the sidewalls 124 and the upper surface of the gate insulating film 125.

FIGS. 44 to 50 are sectional views showing a method of manufacturing the MOSFET shown in FIG. 43 in the order of processes. First, by the same method as that described above, the same structure as that shown in FIG. 37 is obtained. Subsequently, the silicon oxide film 127 is formed on the main surface of the semiconductor substrate 101 by a thermal oxidation. Next, by CVD, a polysilicon film is formed on the silicon oxide film 127. Then, the polysilicon film is patterned into given shape by photolithography and anisotropic dry etching to selectively form a dummy electrode 128 composed of polysilicon film on the silicon oxide film 127 (FIG. 44).

Next, arsenic ions 129 are implanted by an ion implantation into the semiconductor substrate 101 to form the extensions 121 in the main surface of the semiconductor substrate 101 (FIG. 45). Next, a silicon nitride film is formed on the entire surface by a CVD. Subsequently, the silicon nitride film is etched by an anisotropic dry etching to form the sidewalls 124 composed of the silicon nitride film on the sides of the dummy electrode 128. After that, arsenic ions 130 are implanted into the semiconductor substrate 101 by an ion implantation to form the source/drain regions 122 which are deeper than the extensions 121 (FIG. 46). Then a thermal treatment is applied to activate the implanted arsenic ions 130.

Next, a silicon oxide film is formed all over the surface by a CVD. Next, the silicon oxide film is polished by CMP until the upper surface of the dummy electrode 128 is exposed to form the silicon oxide film 123 (FIG. 47). Next, the dummy electrode 128 and the silicon oxide film 127 under the dummy electrode 128 are removed (FIG. 48). In FIG. 48, the silicon oxide films 123 and 127 and the sidewalls 124 serve as a mold for forming the gate electrode.

Next, the gate insulating film 125 composed of silicon oxide film is formed on the main surface of the semiconductor substrate 101 by a thermal oxidation. After that, a tungsten nitride film 131 and a tungsten film 132 are formed in this order by CVD or sputtering on the entire surface (FIG. 49). Next, by photolithography, a photoresist 133 having a given pattern is formed on the tungsten film 132. After this, the tungsten nitride film 131 and the tungsten film 132 are etched by an anisotropic dry etching to form the gate electrode 126 made of the tungsten nitride film 134 and the tungsten film 135 (FIG. 50). As shown in FIG. 50, the side ends of the gate electrode 126 extend on the silicon oxide film 123. Next, the photoresist 133 on the tungsten nitride film 135 is removed to obtain the structure shown in FIG. 43.

These conventional semiconductor devices and manufacturing methods have the following problems. First, while reducing the channel length is effective to enhance the driving capability of the MOSFET so as to increase the operating speed, the channel length in the conventional semiconductor device and manufacturing method shown in FIGS. 36 and 43, for example, is approximately equal to the gate length of the dummy electrode 150. Accordingly, since the channel length is defined by the minimum resolution limit in the photolithography technique adopted when forming the dummy electrode 150, it is difficult to reduce the channel length. Furthermore, if the dummy electrode is simply downsized to reduce the channel length, it will raise the problem that the gate resistance of the gate electrode increases.

Moreover, as shown in FIG. 36, for example, the upper surface of the gate electrode 106 composed of metal film is exposed in the conventional semiconductor device and its manufacturing method. Hence, when forming a contact hole to make electrical contact with the source/drain regions, the self-aligned contact formation technique cannot be used to avoid contact between the gate electrode and the contact hole.

SUMMARY OF THE INVENTION

According to a first aspect of the present invention, a semiconductor device comprises: a substrate; source/drain regions formed in a main surface of the substrate with a channel region interposed therebetween; a gate insulating film formed on the main surface of the substrate in an area in which the channel region is formed; and an inversely tapered gate electrode formed on an upper surface of the gate insulating film.

According to a second aspect of the present invention, a semiconductor device comprises: a substrate; source/drain regions formed in a main surface of the substrate with a channel region interposed therebetween; a first insulating film formed on the main surface of the substrate in an area in which the source/drain regions are formed; sidewalls composed of a second insulating film and formed on sides of the first insulating film; a gate insulating film composed of a third insulating film and formed on the main surface of the substrate in an area in which the channel region is formed; and a gate electrode formed to fill an inversely tapered recessed portion formed by sides of the sidewalls and an upper surface of the gate insulating film.

Preferably, according to a third aspect of the invention, in the semiconductor device, the third insulating film is composed of a material having a larger dielectric constant than silicon oxide film.

Preferably, according to a fourth aspect of the invention, in the semiconductor device, the third insulating film is formed to extend only onto the sides of the sidewalls.

Preferably, according to a fifth aspect of the invention, the semiconductor device further comprises an impurity region locally formed in the substrate only under the gate insulating film and having a conductivity type which is opposite to that of the source/drain regions.

Preferably, according to a sixth aspect of the invention, in the semiconductor device, the source/drain regions are formed in the main surface of the substrate also in areas in which the sidewalls are formed, and the semiconductor device further comprises an impurity region locally formed in the substrate only under the gate insulating film and the sidewalls and having a conductivity type which is opposite to that of the source/drain regions.

Preferably, according to a seventh aspect of the invention, the semiconductor device further comprises a fourth insulating film formed on an upper surface of the gate electrode and surrounding the gate electrode with the sidewalls, wherein the second and fourth insulating films are composed of a material which is different from that of the first insulating film.

Preferably, according to an eighth aspect of the invention, in the semiconductor device, the gate electrode has its peripheral part formed to extend on an upper surface of the first insulating film.

According to a ninth aspect of the present invention, a method for manufacturing a semiconductor device comprises the steps of: (a) forming a structure on a main surface of a substrate in an area in which a gate electrode is formed later; (b) forming source/drain regions in the main surface of the substrate in an area in which the structure is not formed; (c) forming a first insulating film on the main surface of the substrate in an area in which the structure is not formed; (d) after the step (c), removing the structure; (e) forming a second insulating film on the construction obtained by the step (d) and etching the second insulating film by an anisotropic etching whose etching rate is higher in depth direction of the substrate to form sidewalls on sides of the first insulating film; (f) forming a gate insulating film composed of a third insulating film on the main surface of the substrate in an area in which the first insulting film and the sidewalls are not formed; and (g) forming the gate electrode to fill an inversely tapered recessed part formed by sides of the sidewalls and an upper surface of the gate insulating film.

Preferably, according to a tenth aspect of the invention, in the semiconductor device manufacturing method, in the step (a), the structure is formed by stacking a first film composed of a material which is different from that of the second insulating film and a second film composed of a material which is different from that of the first insulating film in this order, and the step (d) comprises the steps of; (d-1) between the step (c) and the step (e), removing the second film with the first film left unremoved, and (d-2) between the step (e) and the step (f), removing the first film by a wet etching.

Preferably, according to an eleventh aspect of the invention, in the semiconductor device manufacturing method, in the step (a), the structure is formed with a material which is different from that of the first insulating film, and in the step (d), the structure is removed by a wet etching.

Preferably, according to a twelfth aspect of the invention, in the semiconductor device manufacturing method, in the step (f), the third insulating film is formed with a material having a larger dielectric constant than silicon oxide film.

Preferably, according to a thirteenth aspect of the invention, in the semiconductor device manufacturing method, the step (f) comprises the steps of, (x-1) forming the third insulating film on the construction obtained by the step (e), and (x-2) removing the third insulating film formed on an upper surface of the first insulating film.

Preferably, according to a fourteenth aspect of the invention, in the semiconductor device manufacturing method, the step (g) comprises the steps of; (y-1) after the step (x-1), forming a conductor film which is a material of the gate electrode on the third insulating film, and (y-2) after the step (y-1), thinning the conductor film until the upper surface of the first insulating film is exposed to form the gate insulating film, and the step (x-2) is performed together in the process in which the step (y-2) is performed.

Preferably, according to a fifteenth aspect of the invention, in the semiconductor device manufacturing method, the step (g) comprises the steps of; (z-1) after the step (x-1), forming a conductor film which is a material of the gate electrode on the third insulating film, and (z-2) between the step (z-1) and the step (x-2), thinning the conductor film until the third insulating film formed on the upper surface of the first insulating film is exposed to form the gate electrode, and in the step (x-2), the third insulating film is removed by etching the third insulating film exposed in the step (z-2).

Preferably, according to a sixteenth aspect of the invention, the semiconductor device manufacturing method further comprises the step of: (h) between the step (e) and the step (f), introducing an impurity into the substrate by using the first insulating film and the sidewalls as masks to form an impurity region having a conductivity type which is opposite to that of the source/drain regions.

Preferably, according to a seventeenth aspect of the invention, in the semiconductor device manufacturing method, in the step (b), the source/drain regions are formed to extend also under peripheral part of the structure in the main surface of the substrate, and the manufacturing method further comprises the step of: (i) between the step (d) and the step (e), introducing an impurity into the substrate by using the first insulating film as a mask to form an impurity region having a conductivity type which is opposite to that of the source/drain regions.

Preferably, according to an eighteenth aspect of the invention, in the semiconductor device manufacturing method, the first insulating film is composed of a material which is different from that of the second insulating film, and the manufacturing method further comprises the steps of; (j) removing the gate electrode for a given film thickness from its upper surface, and (k) after the step (j), forming a fourth insulating film composed of a material which is different from that of the first insulating film on the gate electrode.

Preferably, according to a nineteenth aspect of the invention, in the semiconductor device manufacturing method, the step (g) comprises the steps of; (g-1) forming a conductor film which is a material of the gate electrode on the construction obtained by the step (f), and (g-2) patterning the conductor film to form the gate electrode having its peripheral part extending on an upper surface of the first insulating film.

According to the first aspect of the present invention, the gate length in the upper part of the gate electrode is longer than that in its lower part, so that the gate resistance can be reduced without enlarging the channel length.

According to the second aspect of the invention, reflecting the shape of the sidewalls, the gate length in the upper part of the gate electrode is longer than that in its lower part. Hence the gate resistance can be reduced without enlarging the channel length.

According to the third aspect of the invention, the gate insulating film capacitance can be larger than that in a semiconductor device having a gate insulating film formed of a silicon oxide film, so that the driving capability of the semiconductor device can be enhanced.

According to the fourth aspect of the invention, the third insulating film is not formed on the upper surface of the first insulating film. Accordingly, when source/drain wiring is formed in the first insulating film to make electrical contact with the source/drain regions, it is possible to avoid the trouble that the wiring capacitance of the source/drain wiring increases due to the third insulating film.

According to the fifth aspect of the invention, it is possible to reduce the junction capacitance caused by the junction between the source/drain regions and the impurity region.

According to the sixth aspect of the invention, it is possible to reduce the junction capacitance caused by the junction between the source/drain regions and the impurity region. Furthermore, the opposite conductivity types cancel each other in the part in which the impurity region and the source/drain regions overlap. As a result, the depth of the source/drain regions becomes shallower under the sidewalls, thus further effectively suppressing the short-channel effect.

According to the seventh aspect of the invention, the gate electrode is surrounded by the second and fourth insulating films made of a different material from that of the first insulating film. Hence, the self-aligned contact formation technique can be used when forming a contact hole in the first insulating film.

According to the eighth aspect of the invention, the gate length in the upper part of the gate electrode can be still longer to further reduce the gate resistance.

According to the ninth aspect of the invention, reflecting the shape of the sidewalls, the gate length in the upper part of the gate electrode is longer than that in its lower part. Hence the gate resistance can be reduced without enlarging the channel length under the gate insulating film.

According to the tenth aspect of the invention, in the step (d-1), only the second film can be removed without removing the first insulating film. In the step (d-2), only the first film can be removed without removing the sidewalls. Furthermore, the main surface of the substrate can be protected from damage when removing the first film.

According to the eleventh aspect of the invention, only the structure can be removed without removing the first insulating film. Furthermore, the main surface of the substrate can be protected from damage when removing the structure.

According to the twelfth aspect of the invention, the gate insulating film capacitance can be larger than that of a gate insulating film formed of a silicon oxide film, so that the driving capability of the semiconductor device can be enhanced.

According to the thirteenth aspect of the invention, the third insulating film formed on the upper surface of the first insulating film in the step (x-1) is removed in the step (x-2). Accordingly, when source/drain wiring for making electric contact with the source/drain regions is formed in the first insulating film, it is possible to prevent the wiring capacitance of the source/drain wiring from increasing due to the third insulating film.

According to the fourteenth aspect of the invention, the third insulating film can be removed at the same time in the process of thinning the conductor film for forming the gate electrode. Hence, the third insulating film formed on the upper surface of the first insulating film can be removed without increasing the number of manufacturing process steps.

According to the fifteenth aspect of the invention, the process of thinning the conductor film is stopped when the third insulating film is exposed, and the third insulating film formed on the upper surface of the first insulating film is removed by etching. Accordingly, the upper part of the gate electrode having a longer gate length is not removed in the thinning process, and therefore the gate resistance can be further reduced.

According to the sixteenth aspect of the invention, an impurity region having an opposite conductivity type to that of the source/drain regions and for adjusting the operation threshold voltage of the semiconductor device can be locally formed in the substrate only under the gate insulating film. Hence junction capacitance caused by the junction between the source/drain regions and the impurity region can be reduced.

According to the seventeenth aspect of the invention, an impurity region having an opposite conductivity type to that of the source/drain regions and for adjusting the operation threshold voltage of the semiconductor device can be locally formed in the substrate only under the gate insulating film and the sidewalls. Hence junction capacitance caused by the junction between the source/drain regions and the impurity region can be reduced. Furthermore, the opposite conductivity types cancel each other in the part in which the impurity region and the source/drain regions overlap. As a result, the depth of the source/drain regions under the sidewalls becomes shallower and the effect of suppressing the short-channel effect is enhanced.

According to the eighteenth aspect of the invention, the gate electrode can be surrounded by the second and fourth insulating films formed of a different material from that of the first insulating film. Accordingly, the self-aligned contact formation technique can be used when forming a contact hole in the first insulating film.

According to the nineteenth aspect of the invention, the gate length in the upper part of the gate electrode can be still longer to further reduce the gate resistance.

The present invention has been made to solve the above-described problems, and an object of the present invention is to obtain a semiconductor device in which the channel length can be reduced without increasing the gate resistance so that the driving capability of MOSFET can be improved to realize higher-speed operation and a manufacturing method thereof, and to obtain a semiconductor device having a gate electrode which allows the use of the self-aligned contact formation technique and its manufacturing method.

These and other objects, features, aspects and advantages of the present invention will become more apparent from the following detailed description of the present invention when taken in conjunction with the accompanying drawings.

DESCRIPTION OF THE PREFERRED EMBODIMENTS

First Preferred Embodiment

Figure 1:
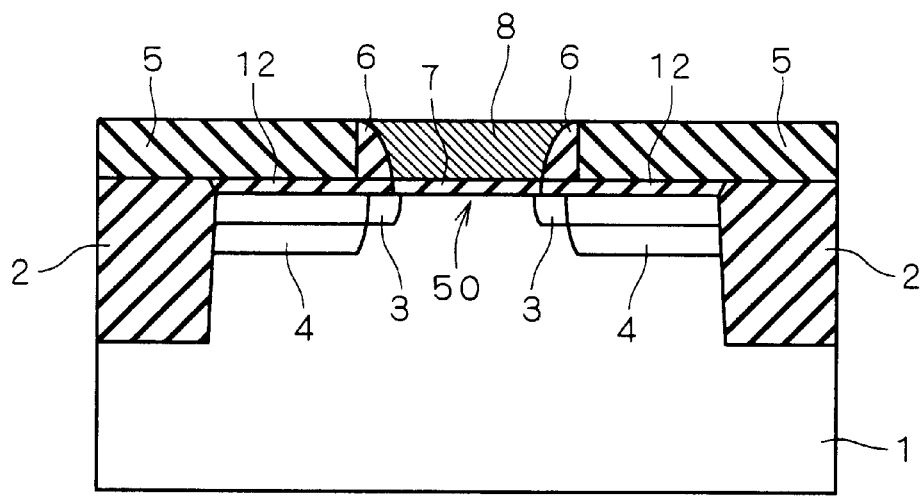
FIG. 1 is a sectional view showing the structure of an MOSFET according to a first preferred embodiment of the present invention.

FIG. 1 is a sectional view showing the structure of an MOSFET according to a first preferred embodiment of the present invention. As shown in FIG. 1, the MOSFET of the first preferred embodiment has a semiconductor substrate 1, a trench-type element isolation structure 2 formed in the element isolation region in the main surface of the semiconductor substrate 1, a pair of extensions 3 and source/drain regions 4 selectively formed in the element formation region in the main surface of the semiconductor substrate 1 to face each other through a channel region 50, a silicon oxide film 5 formed on the trench-type element isolation structure 2 and on the source/drain regions 4 with a silicon oxide film 12 interposed therebetween, sidewalls 6 formed on the sides of the silicon oxide film 5, a gate insulating film 7 formed on the main surface of the semiconductor substrate 1 in the part in which the channel region 50 is formed, and a gate electrode 8 formed to fill the recessed portion formed by the sides of the sidewalls 6 and the upper surface of the gate insulating film 7.

Figure 2:
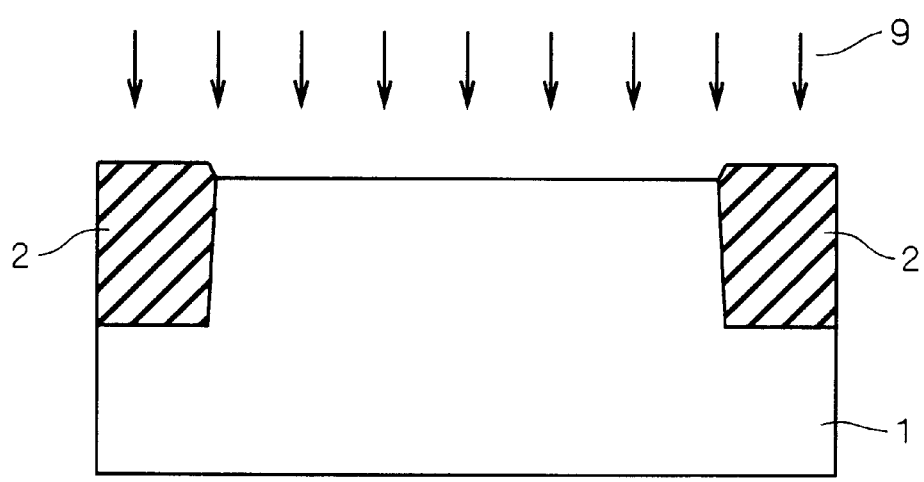
FIGS. 2 to 14 are sectional views showing a method of manufacturing the MOSFET of the first preferred embodiment of the invention in the order of processes.

FIGS. 2 to 14 are sectional views showing a method for manufacturing the MOSFET of the first preferred embodiment of the invention in the order of process steps. First, the trench-type element isolation structure 2 filled with insulating film is formed in the element isolation region in the main surface of the semiconductor substrate 1 made of single crystal silicon. Subsequently, to form a well and to adjust the operation threshold voltage of the MOSFET, boron ions 9 are implanted into the semiconductor substrate 1 by an ion implantation (FIG. 2).

Figure 3:
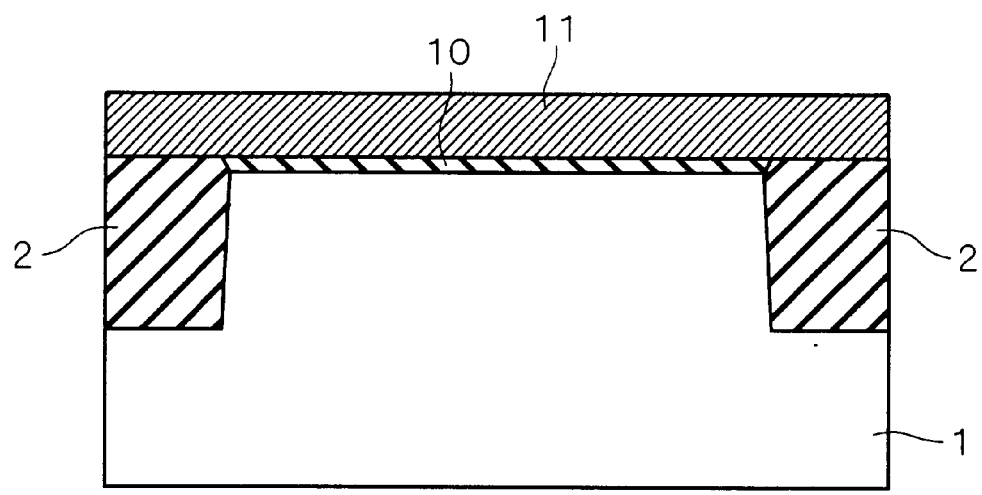
Figure 4:
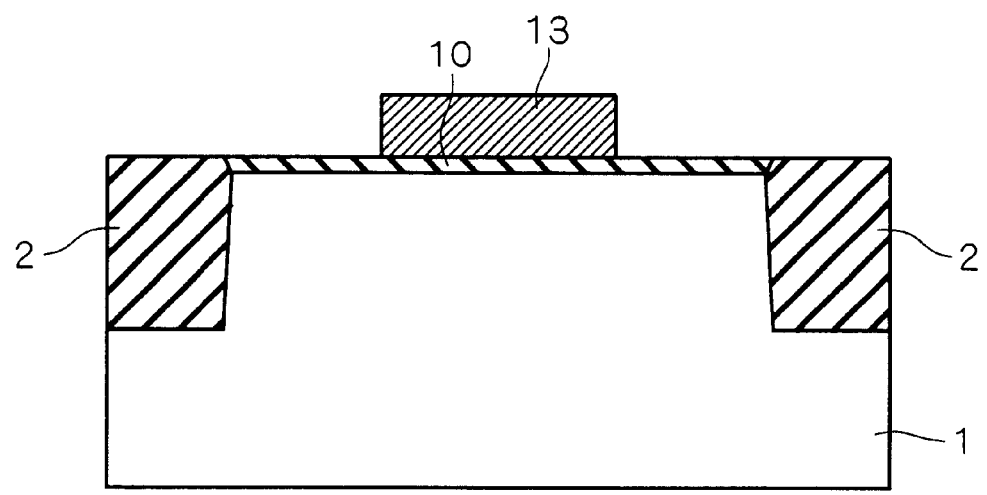

Next, a silicon oxide film 10 having a film thickness of about 3 to 10 nm is formed by a thermal oxidation on the main surface of the semiconductor substrate 1. Subsequently, a polysilicon film 11 having a film thickness of about 200 nm is formed by CVD on the silicon oxide film 10 (FIG. 3). Next, the polysilicon film 11 is patterned into given shape by photolithography and anisotropic dry etching to selectively form a dummy electrode 13 (a structure) composed of the polysilicon film on the silicon oxide film 10 (FIG. 4).

Figure 5:
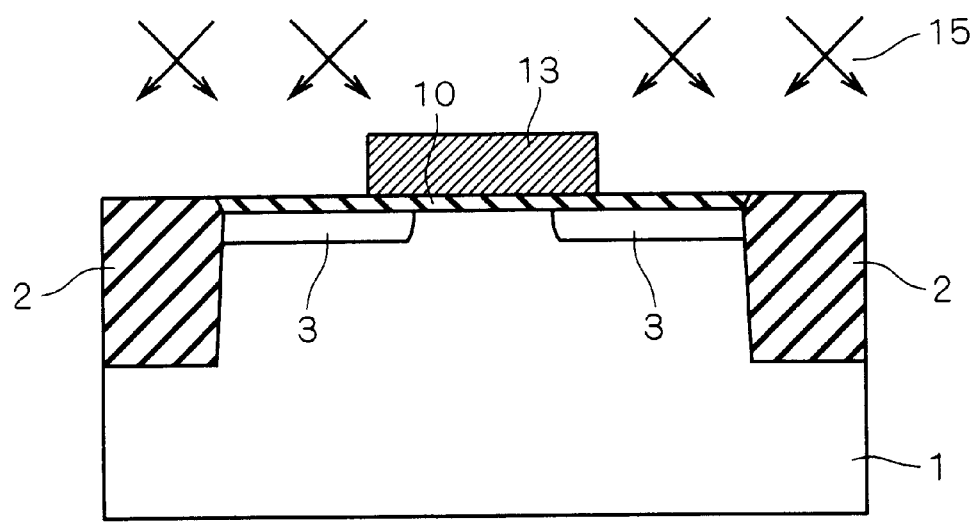
Figure 6:
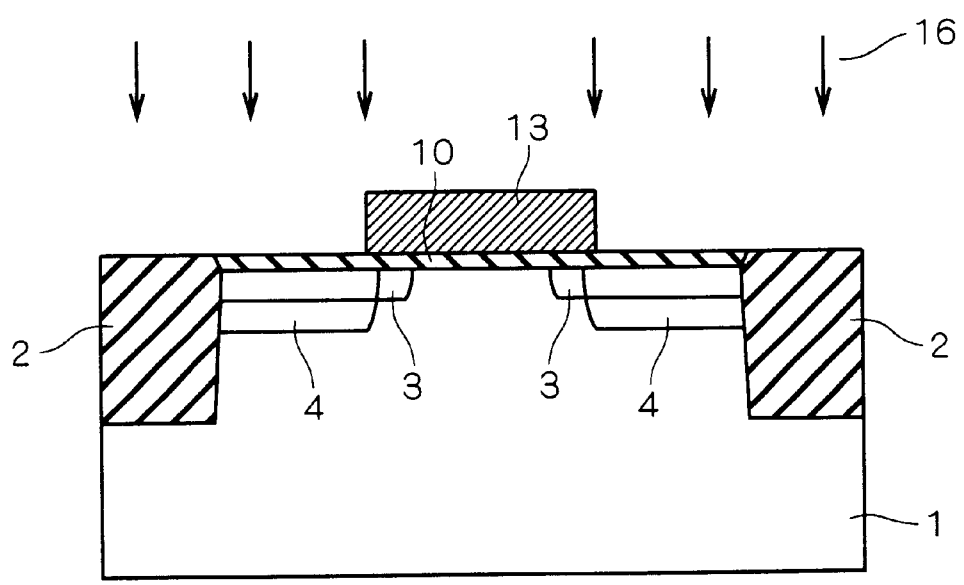

Next, arsenic ions 15 are implanted into the semiconductor substrate 1 by an ion implantation, with an implant energy in the range of 5 to 30 keV and in the implant direction inclined at 30 to 70 degrees with respect to the normal direction of the main surface of the semiconductor substrate 1. This forms the extensions 3 in the main surface of the semiconductor substrate 1 (FIG. 5). Next, arsenic ions 16 are implanted into the semiconductor substrate 1 by an ion implantation, with an implant energy in the range of 10 to 50 keV and in the implant direction perpendicular to or inclined at about 10 degrees with respect to the normal direction of the main surface of the semiconductor substrate 1. This forms the source/drain regions 4 in the main surface of the semiconductor substrate 1; the source/drain regions are deeper than the extensions 3 and extend in less distance under the dummy electrode 13 (FIG. 6). Then the implanted arsenic ions 16 are activated by a thermal treatment.

Figure 7:
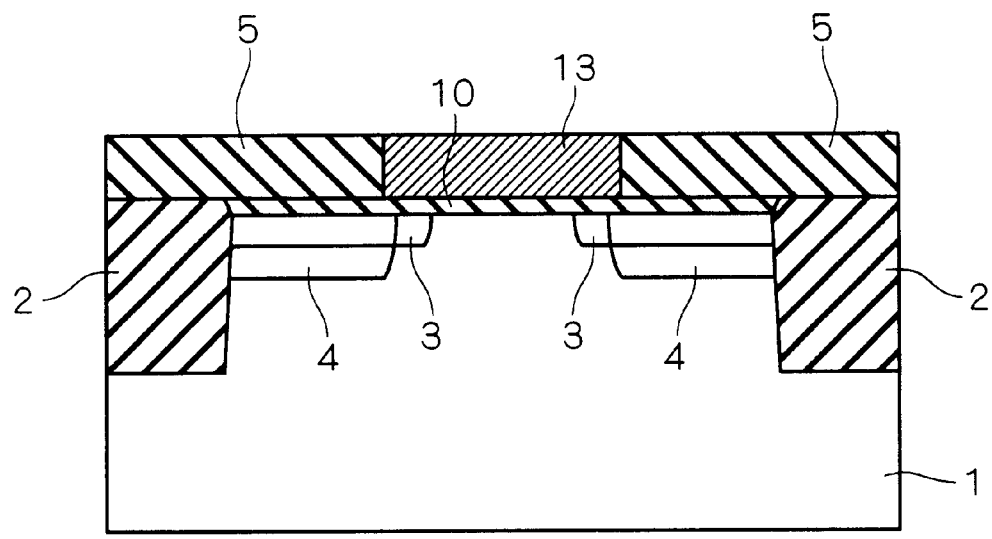
Figure 8:
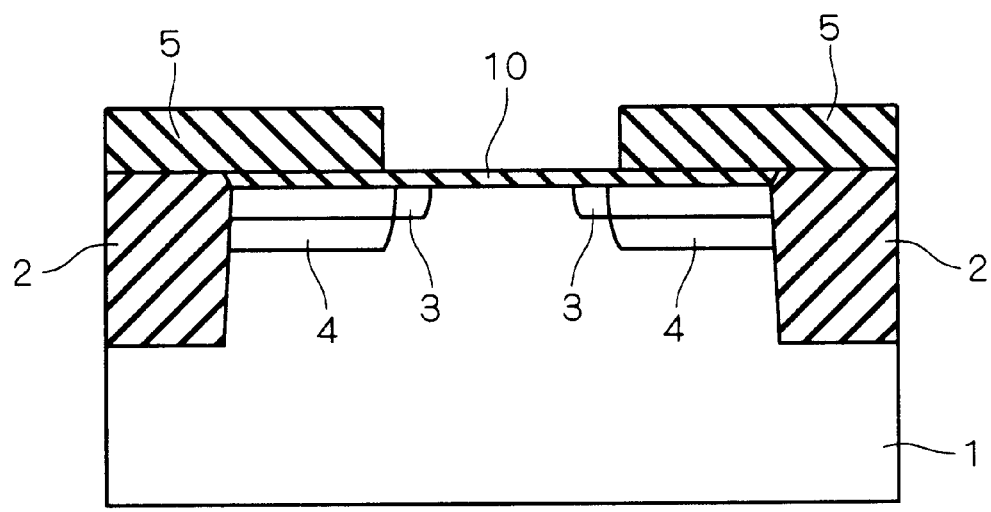

Next, a silicon oxide film having a film thickness of about 400 nm is formed by a CVD over the entire surface. An insulating film made of a material having a smaller dielectric constant than the silicon oxide film may be formed in place of the silicon oxide film. Subsequently, the silicon oxide film is polished by a CMP method until the upper surface of the dummy electrode 13 is exposed to form the silicon oxide film 5 (FIG. 7). Next the dummy electrode 13 is removed by a dry etching or wet etching (FIG. 8). In FIG. 8, the silicon oxide film 5 serves as a mold for forming the gate electrode.

Figure 9:
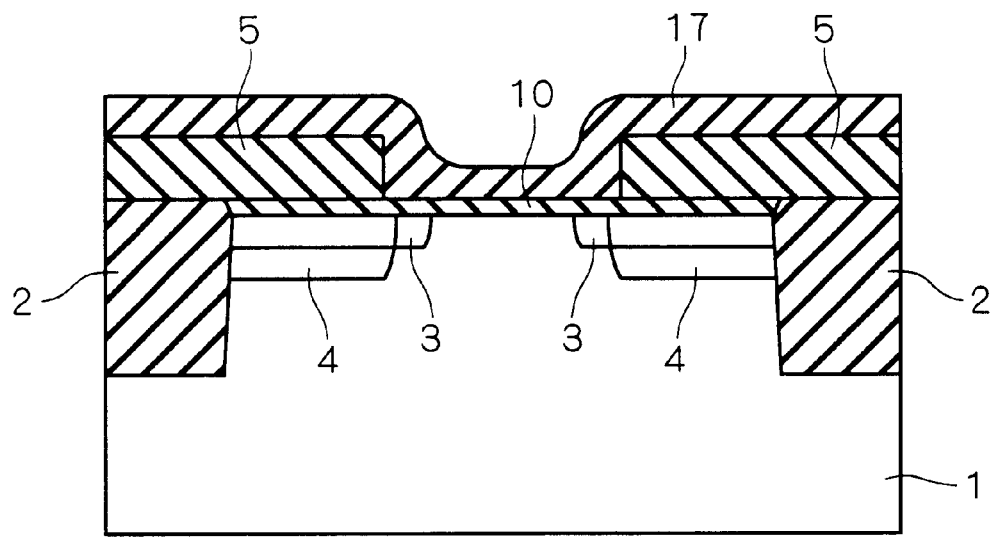
Figure 10:
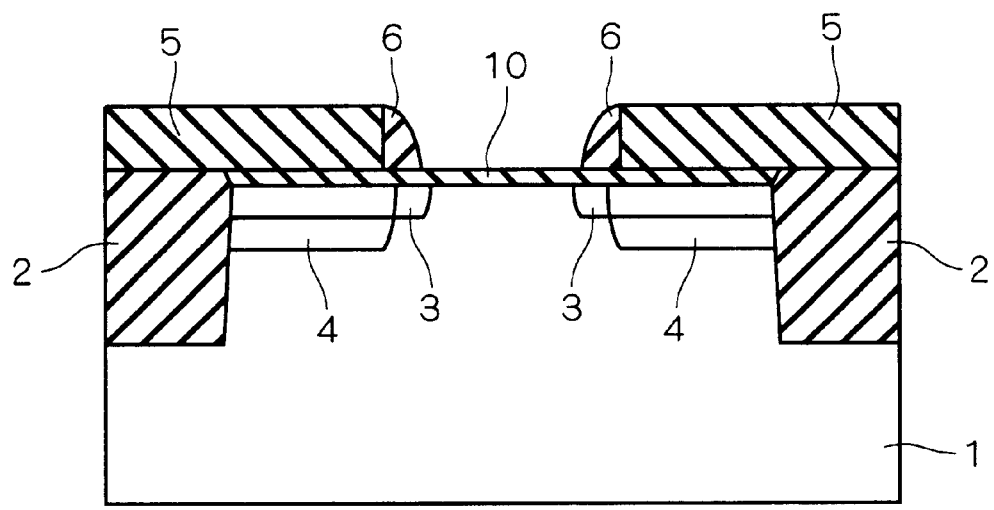
Figure 11:
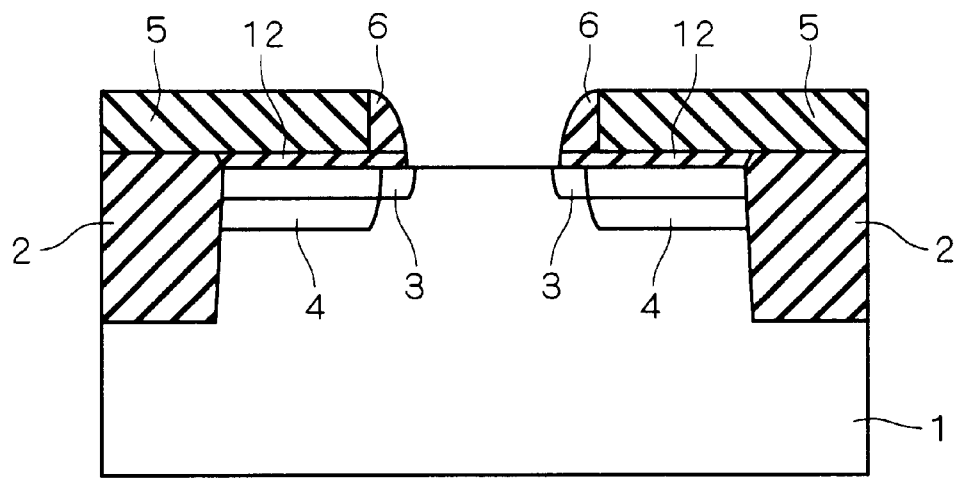

Next, a silicon nitride film 17 having a film thickness of about 10 to 50 nm is formed by a CVD over the entire surface (FIG. 9). Next, the silicon nitride film 17 is etched by an anisotropic dry etching whose etching rate is higher in the direction of the depth of the semiconductor substrate 1, so as to form the sidewalls 6 made of the silicon nitride film on the sides of the silicon oxide film 5 (FIG. 10). Next, the silicon oxide film 10 is removed by a wet etching using HF in the part in which the silicon oxide film 5 and the sidewalls 6 are not formed to expose the main surface of the semiconductor substrate 1. At this time, the silicon oxide film 12 remains on the main surface of the semiconductor substrate 1 as the unremoved part of the silicon oxide film 10 (FIG. 11).

Figure 12:
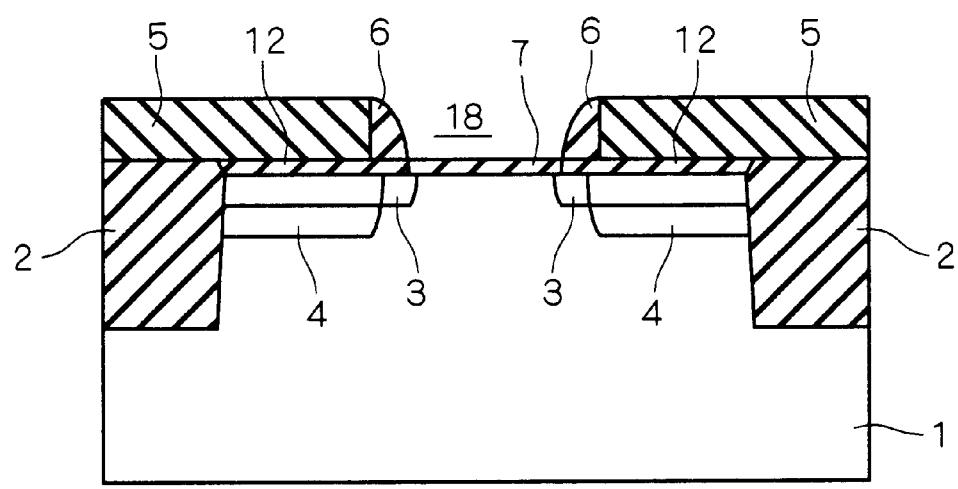
Figure 13:
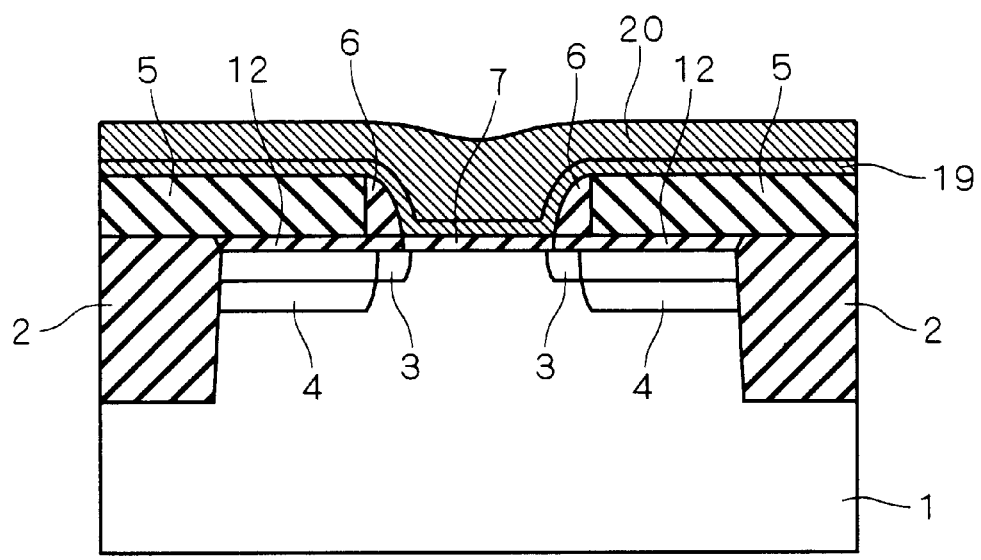

Next, the gate insulating film 7 made of silicon oxide film having a film thickness of about 2 to 10 nm is formed by a thermal oxidation on the main surface of the semiconductor substrate 1. As a result, the sides of the sidewalls 6 and the upper surface of the gate insulating film 7 form a recessed portion 18 (FIG. 12). As shown in FIG. 12, reflecting the shape of the sidewalls 6, the recessed portion 18 is in inversely tapered form which spreads toward the top. Next, a tungsten nitride film 19 having a film thickness of about 20 to 100 nm is formed over the entire surface by a CVD or sputtering. Subsequently, a tungsten film 20 having a film thickness of about 100 to 400 nm is formed over the entire surface by a CVD or sputtering (FIG. 13). The tungsten nitride film 19 serves as barrier metal for inhibiting reaction between the gate insulating film 7 and the tungsten film 20.

Figure 14:
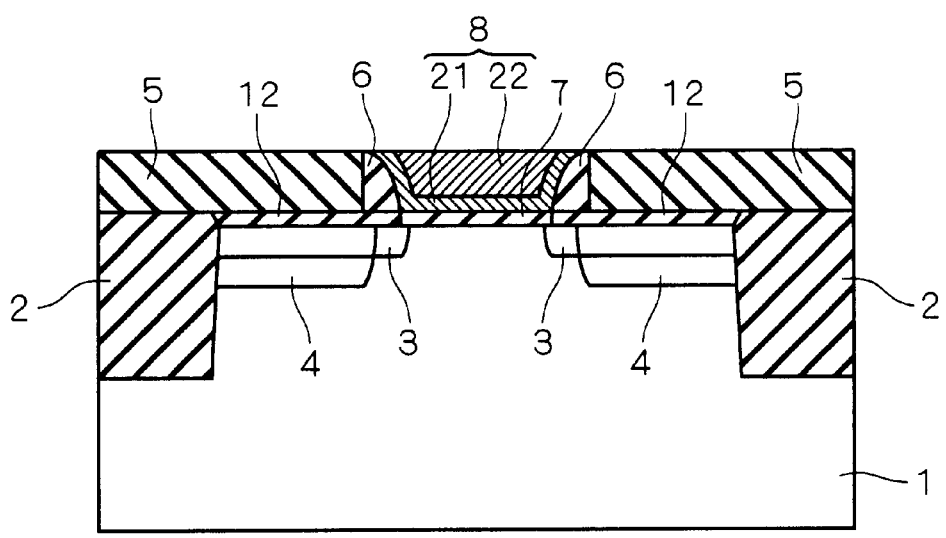

Next, the tungsten film 20 and the tungsten nitride film 19 are polished away (thinned) by CMP until the upper surface of the silicon oxide film 5 is exposed. Thus the gate electrode 8 is formed with the tungsten nitride film 21 and the tungsten film 22 to fill the recessed portion 18 (FIG. 14). The structure shown in FIG. 1 is obtained through these processes.

While a method of manufacturing NMOSFET has been described above, PMOSFET can be manufactured by using an ion-implanted dopant of the opposite conductivity type. Further, CMOSFET can be manufactured by performing selective ion implantation using photolithography technique to form NMOSFET and PMOSFET.

Although the gate insulating film 7 is newly formed after removal of the silicon oxide film 10 in the example above, the silicon oxide film 10 may be used as a gate insulating film without removal. Further, while the gate insulating film 7 made of silicon oxide film is formed by thermal oxidation in the example above, a gate insulating film made of nitrided oxide may be formed by adding gas, such as NO, $N_2O$, $NH_3$, in the thermal oxidation. Moreover, while the tungsten nitride film 19 is used as a barrier metal in the example above, a film of other metal nitride, such as titanium nitride film or tantalum nitride film, may be used in place of the tungsten nitride film. In the example above, the tungsten film 22 is used as a metal film for the gate electrode 8, but other metal film, such as aluminum film, may be used in place of the tungsten film.

As has been described above, according to the MOSFET of the first preferred embodiment and its manufacturing method, the gate electrode 8 is formed after the sidewalls 6 are formed on the sides of the silicon oxide film 5. Accordingly, reflecting the shape of the sidewalls 6, the gate electrode 8 can be formed in an inversely tapered shape with its gate length in the upper part being longer than the gate length in the lower part. As a result, the channel length can be reduced without increasing the gate resistance, and the driving capability of the MOSFET can be increased to increase the operating speed. Furthermore, since the channel length is shorter than the gate length of the dummy electrode 13 by the width of the sidewalls 6, the channel length can be shorter than the gate length defined by the minimum resolution limit in the photolithography technique adopted when forming the dummy electrode 13.

The sidewalls 6 are composed of silicon nitride film. Accordingly, when removing the silicon oxide film 10 by using HF after formation of the sidewalls 6, and when cleaning the main surface of the semiconductor substrate 1 with HF before formation of the gate insulating film 7, the sidewalls 6 are not removed together and therefore the channel length is not lengthened.

The dummy electrode 13 is formed on the silicon oxide film 10. Accordingly, even when the dummy electrode 13 is removed by dry etching, the presence of the silicon oxide film 10 prevents the main surface of the semiconductor substrate 1 from being damaged. Similarly, the sidewalls 6 are formed on the silicon oxide film 10, too. Hence, when etching the silicon nitride film 17 to form the sidewalls 6, it can be etched by using anisotropic dry etching with a high etching selectivity between silicon nitride film, the material of the sidewalls 6, and silicon oxide film so that the main surface of the semiconductor substrate 1 will not be damaged. As a result, the interface state in formation of the gate insulating film 7 on the main surface of the semiconductor substrate 1 can be reduced to enhance the reliability of the gate insulating film 7.

Figure 15:
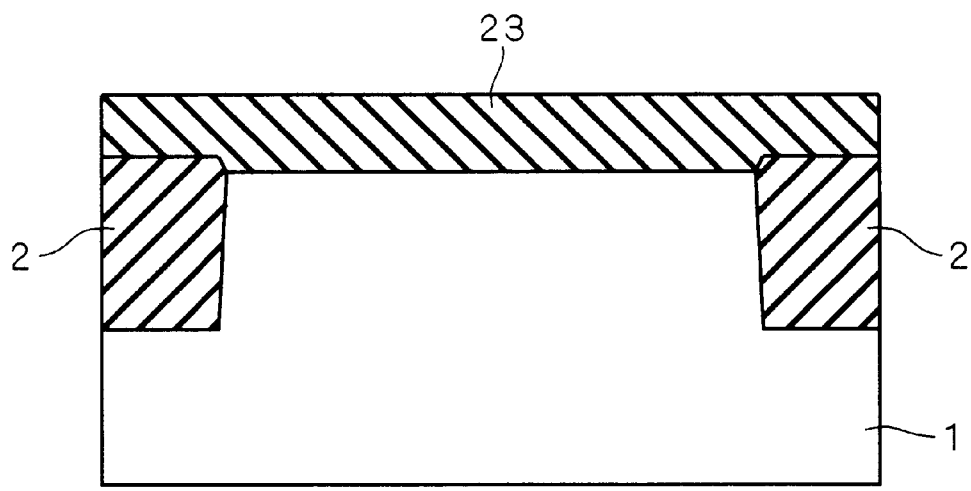
FIGS. 15 to 18 are sectional views showing other methods of manufacturing the MOSFET of the first preferred embodiment of the invention in the order of processes.
Figure 16:
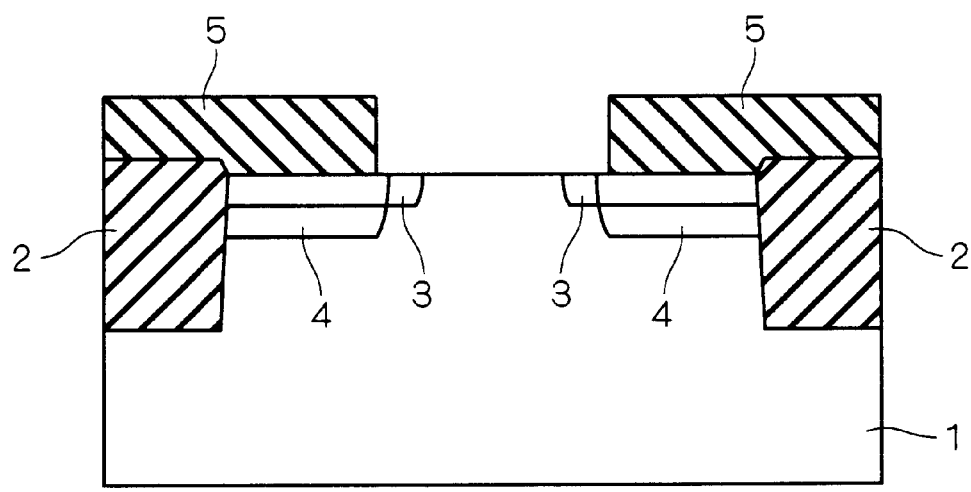

FIGS. 15 to 18 are sectional views showing, in the order of processes, other methods for manufacturing the MOSFET of the first preferred embodiment of the present invention. Instead of forming the silicon oxide film 10 and the polysilicon film 11 in the process of FIG. 3, a silicon nitride film 23 is formed as shown in FIG. 15. Then the dummy electrode can be formed with the silicon nitride film 23. Then, instead of removing the dummy electrode 13 in the process of FIG. 8 and removing the silicon oxide film 10 in the process of FIG. 11, the dummy electrode made of silicon nitride film 23 is removed by a wet etching using phosphoric acid as shown in FIG. 16. This manufacturing method, too, is capable of preventing the main surface of the semiconductor substrate 1 from being damaged when removing the dummy electrode, thus enhancing the reliability of the gate insulating film 7.

Figure 17:
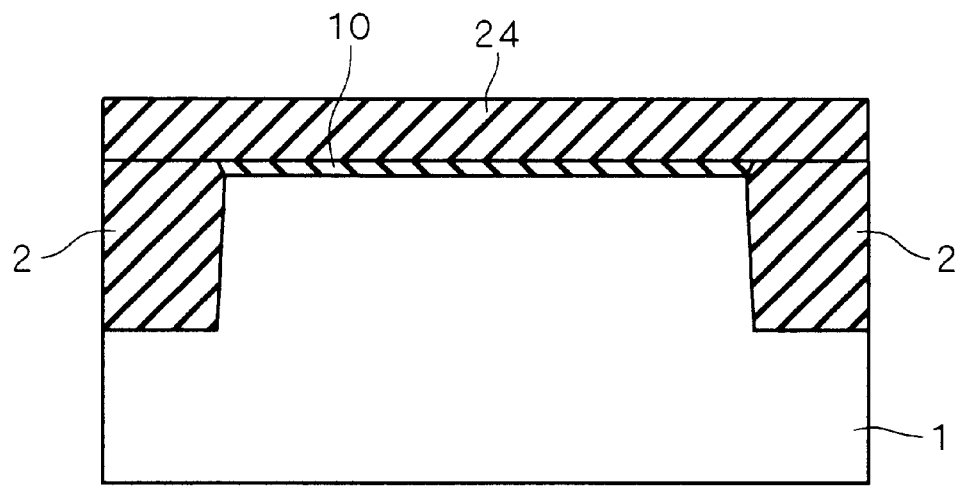
Figure 18:
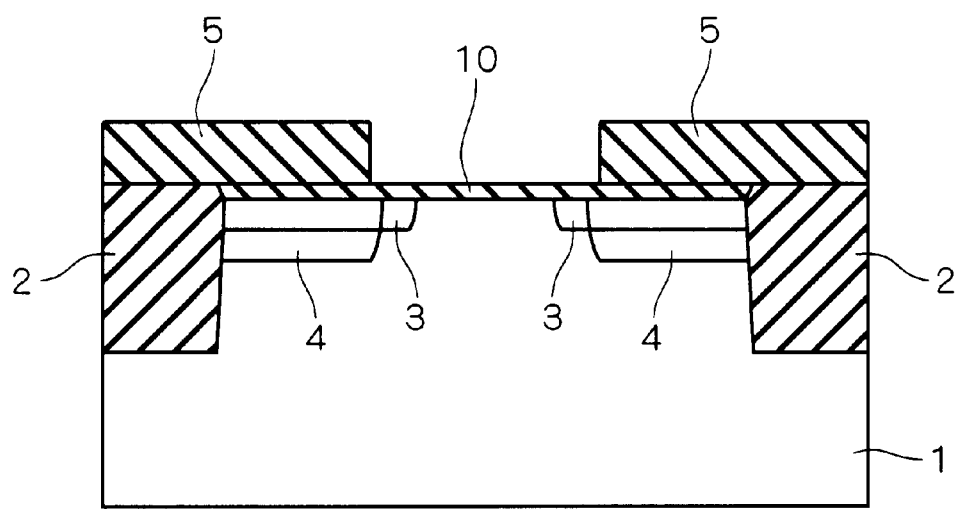

For another method, instead of forming the silicon oxide film 10 and the polysilicon film 11 in the process shown in FIG. 3, the silicon oxide film 10 and a silicon nitride film 24 are formed in this order as shown in FIG. 17. Thus the dummy electrode can be formed with the silicon nitride film 24 on the silicon oxide film 10. Then, instead of removing the dummy electrode 13 in the process shown in FIG. 8, the dummy electrode made of silicon nitride film 24 is removed, as shown in FIG. 18, by a wet etching using phosphoric acid, or by an anisotropic dry etching with a high etching selectivity between silicon nitride film and silicon oxide film. This manufacturing method, too, is capable of preventing the main surface of the semiconductor substrate 1 from being damaged when the dummy electrode is removed and when the sidewalls 6 are formed, leading to higher reliability of the gate insulating film 7.

Second Preferred Embodiment

Figure 19:
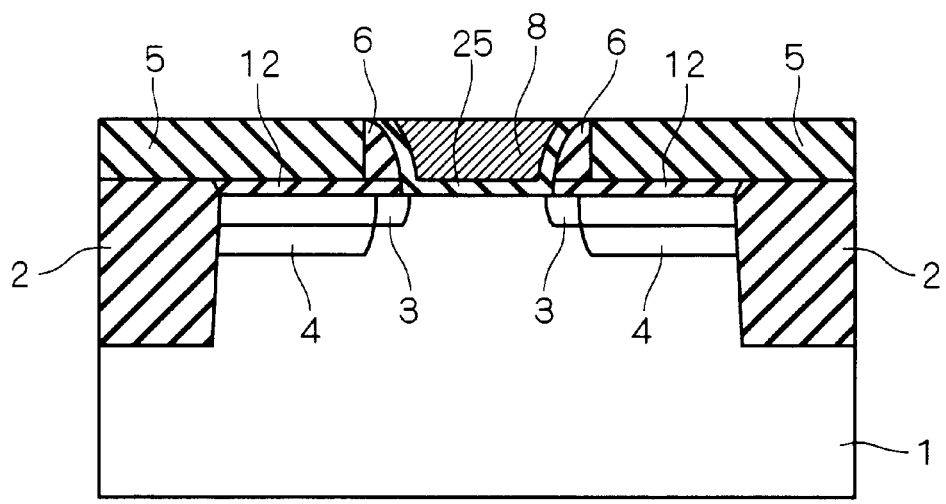
FIG. 19 is a sectional view showing the structure of an MOSFET according to a second preferred embodiment of the present invention.

FIG. 19 is a sectional view showing the structure of an MOSFET according to a second preferred embodiment of the present invention. As shown in FIG. 19, on the basis of the MOSFET of the first preferred embodiment shown in FIG. 1, the MOSFET of the second preferred embodiment has a gate insulating film 25 made of a material having a larger dielectric constant than the silicon oxide film 5. The gate insulating film 25 in FIG. 19 is used in place of the gate insulating film 7 (see FIG. 14, for example) made of silicon oxide film.

Figure 20:
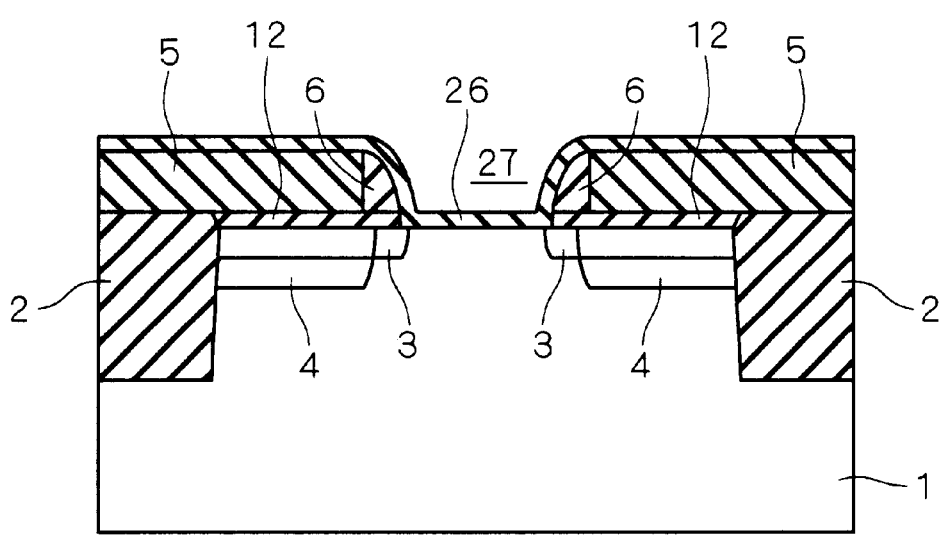
FIGS. 20 to 22 are sectional views showing a method of manufacturing the MOSFET of the second preferred embodiment of the invention in the order of processes.
Figure 21:
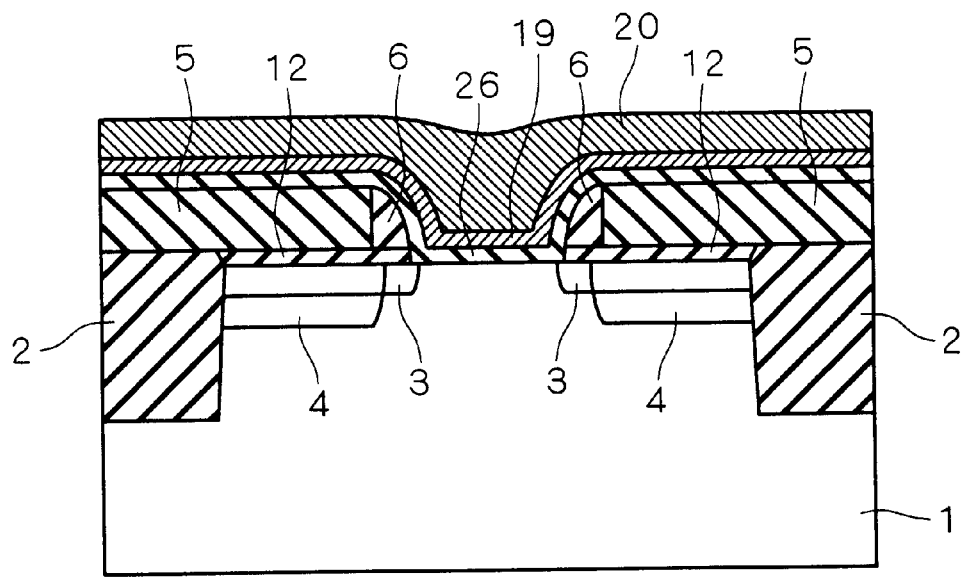
Figure 22:
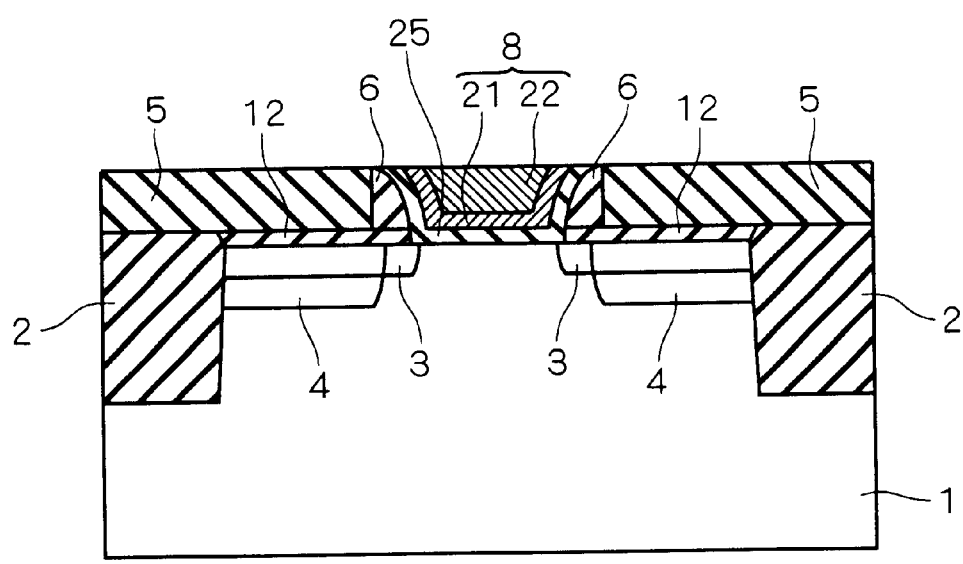

FIGS. 20 to 22 are sectional views showing a method of manufacturing the MOSFET of the second preferred embodiment of the invention in the order of processes. First, the same structure as that shown in FIG. 11 is obtained through the same processes as those in the above-described first preferred embodiment. Next, a tantalum oxide film 26 having a film thickness of about 5 to 30 nm is formed by CVD or sputtering on the entire surface (FIG. 20). Next, as in the first preferred embodiment, the tungsten nitride film 19 and the tungsten film 20 are formed over the entire surface in this order (FIG. 21).

Next, the tungsten film 20, tungsten nitride film 19, and tantalum oxide film 26 are polished by CMP until the upper surface of the silicon oxide film 5 is exposed, thus forming the gate electrode 8 made of the tungsten nitride film 21 and the tungsten film 22 and the gate insulating film 25 made of the tantalum oxide film (FIG. 22). The structure shown in FIG. 19 is obtained through these processes.

While a tantalum oxide film is used as the gate insulating film made of a material having a larger dielectric constant than the silicon oxide film in the example above, other high-dielectric-constant film, such as BST or PZT film, can be used in place of the tantalum oxide film.

As described above, according to the MOSFET of the second preferred embodiment and its manufacturing method, the gate insulating film 25 is formed by using a material having a larger dielectric constant than the silicon oxide film. Hence, as compared with the MOSFET having the gate insulating film 7 made of silicon oxide film in the first preferred embodiment, the gate insulating film capacitance can be made larger if the film thickness of the gate insulating film 7 and the film thickness of the gate insulating film 25 are the same, leading to higher driving capability of the MOSFET.

The tantalum oxide film 26 formed on the silicon oxide film 5 is removed. This prevents the problem that the wiring capacitance of the source/drain wiring formed later increases to slow down the operation speed of the circuit.

Figure 23:
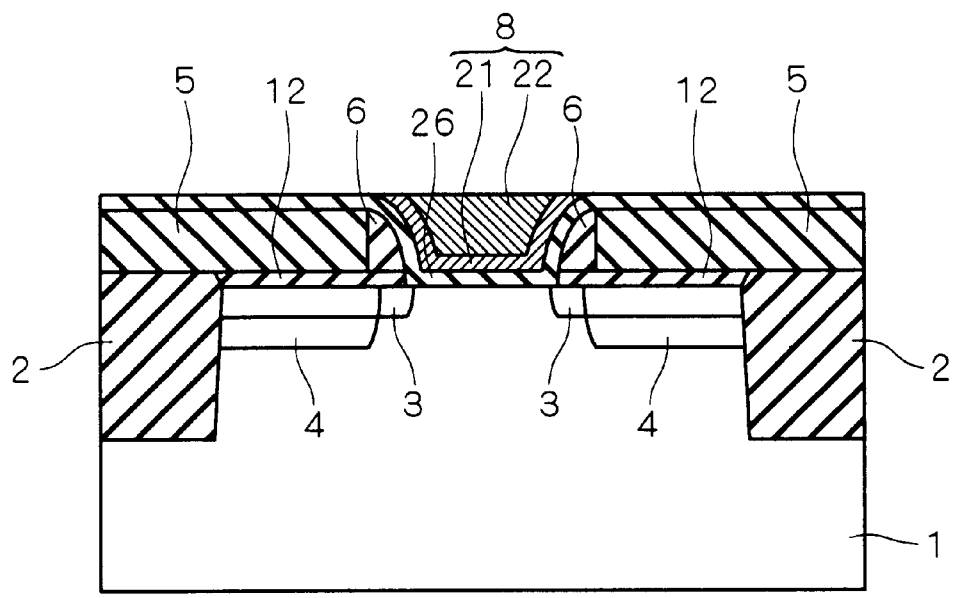
FIGS. 23 and 24 are sectional views showing another method of manufacturing the MOSFET of the second preferred embodiment of the invention in the order of processes.
Figure 24:
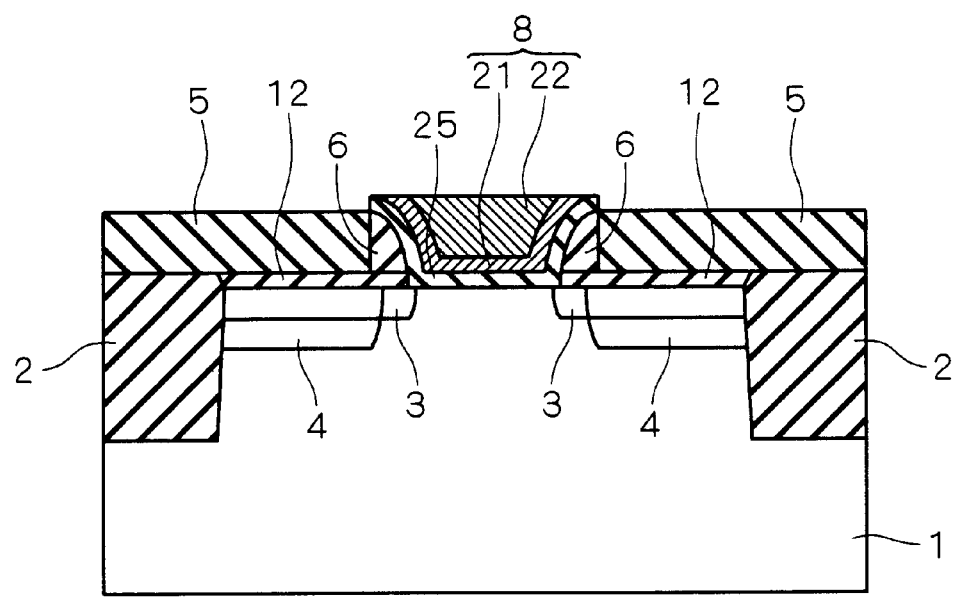

FIGS. 23 and 24 are sectional views showing, in the order of processes, another method for manufacturing the MOSFET of the second preferred embodiment of the invention. First, the same structure as that shown in FIG. 21 is obtained through the same processes as those described above. Next, the tungsten film 20 and the tungsten nitride film 19 are polished away by CMP until the upper surface of the tantalum oxide film 26 is exposed (FIG. 23). Next, the tantalum oxide film 26 exposed by polishing is removed by a dry etching (FIG. 24). When the MOSFET is manufactured by this method, the upper part of the gate electrode 8 having a longer gate length is not removed by polishing. Accordingly, this method provides the effect of further reducing the gate resistance, in addition to the same effects described above. On the other hand, when the tantalum oxide film 26 is removed together by polishing when forming the gate electrode 8 as shown in FIG. 22, the manufacturing process can be simplified since the dry etching process shown in FIG. 24 is not required.

Third Preferred Embodiment

Figure 25:
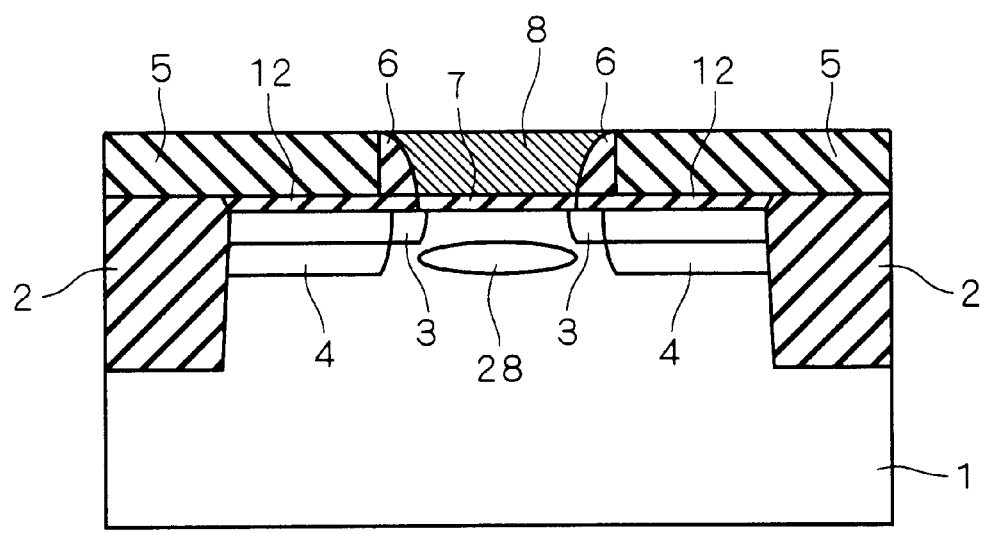
FIG. 25 is a sectional view showing the structure of an MOSFET according to a third preferred embodiment of the present invention.

FIG. 25 is a sectional view showing the structure of an MOSFET according to a third preferred embodiment of the invention. As shown in FIG. 25, on the basis of the MOSFET of the first preferred embodiment shown in FIG. 1, the MOSFET of the third preferred embodiment has a channel doping region 28 for adjusting the operation threshold voltage of the MOSFET, which is locally formed in the semiconductor substrate 1 under the gate insulating film 7.

Figure 26:
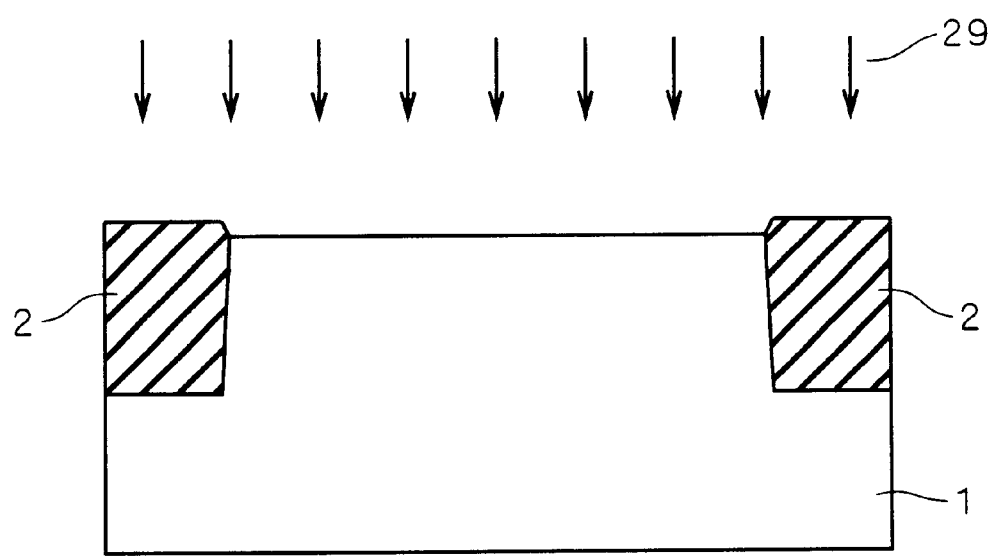
FIGS. 26 and 27 are sectional views showing a method of manufacturing the MOSFET of the third preferred embodiment of the invention in the order of processes.
Figure 27:
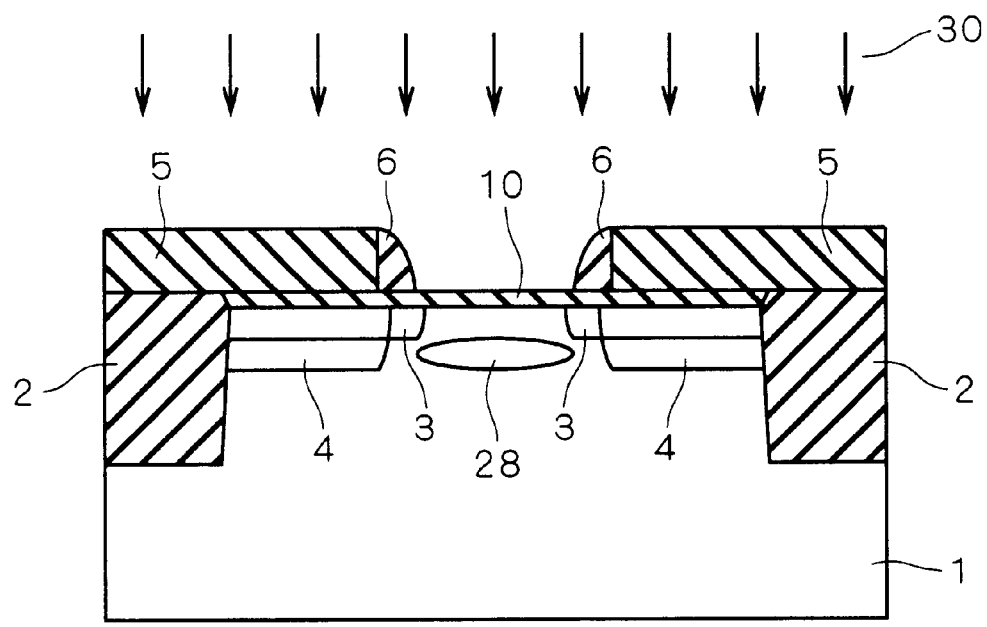

FIGS. 26 and 27 are sectional views showing, in the order of processes, a method of manufacturing the MOSFET according to the third preferred embodiment of the invention. First, the trench-type element isolation structure 2 filled with insulating film is formed in the element isolation region in the main surface of the semiconductor substrate 1 made of single crystal silicon. Subsequently, to form a well, boron ions 29 are implanted into the semiconductor substrate 1 by an ion implantation (FIG. 26). At this time, unlike the first preferred embodiment, ion implantation for adjusting the operation threshold voltage of the MOSFET is not performed. After that, the same structure as that shown in FIG. 10 is obtained through the same processes as those in the first preferred embodiment.

Next, boron ions 30 are implanted into the semiconductor substrate 1 by using the silicon oxide film 5 and the sidewalls 6 as masks, with an implant energy of about 50 keV and a concentration of about $1 \times 10^{12}$ to $3 \times 10^{13}/cm^2$. This locally forms the channel doping region 28 in the semiconductor substrate 1 (FIG. 27). Then the structure shown in FIG. 25 is obtained through the same processes as those in the first preferred embodiment.

In this way, according to the MOSFET of the third preferred embodiment and its manufacturing method, the channel doping region 28 is locally formed in the semiconductor substrate 1 under the gate insulating film 7. Hence the junction capacitance formed by the channel doping region 28 having a first conductivity type (p type in the example) and the extensions 3 and the source/drain regions 4 having a second conductivity type (n type in the example) can be reduced, so as to speed up the operation of the MOSFET.

Further, since the channel doping region 28 is subjected to a less number of thermal treatments, it is possible to prevent the boron ions 30 implanted into the semiconductor substrate 1 from being thermally diffused more than necessary. This enables adequate control of the operation threshold voltage of the MOSFET.

Fourth Preferred Embodiment

Figure 28:
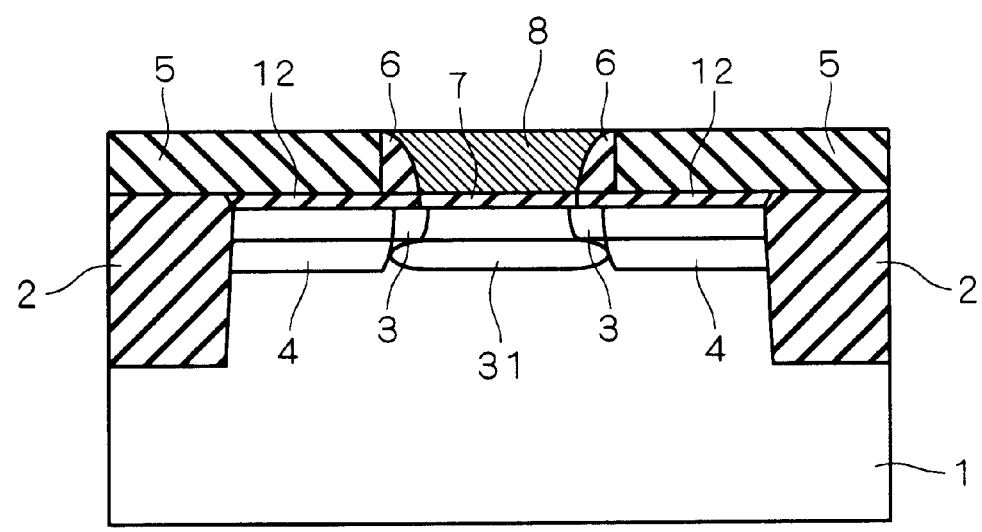
FIG. 28 is a sectional view showing the structure of an MOSFET according to a fourth preferred embodiment of the present invention.

FIG. 28 is a sectional view showing the structure of an MOSFET according to a fourth preferred embodiment of the present invention. As shown in FIG. 28, on the basis of the MOSFET of the first preferred embodiment shown in FIG. 1, the MOSFET of the fourth preferred embodiment has a channel doping region 31 for adjusting the operation threshold voltage of the MOSFET, which is locally formed in the semiconductor substrate 1 under the gate insulating film 7 and the sidewalls 6.

Figure 29:
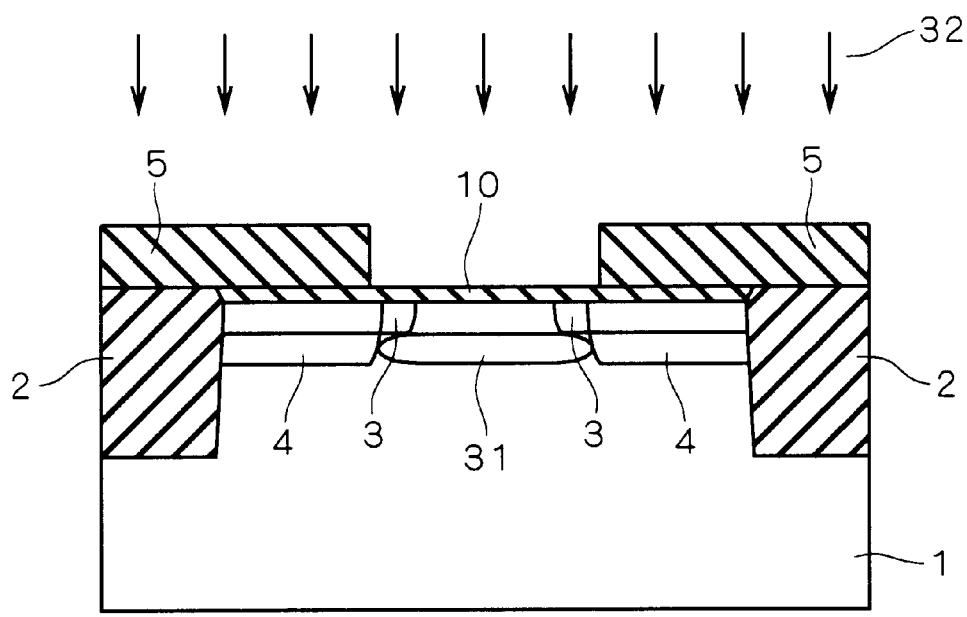
FIG. 29 is a sectional view showing a process step in a method of manufacturing the MOSFET of the fourth preferred embodiment of the invention.

FIG. 29 is a sectional view showing a process in a method of manufacturing the MOSFET of the fourth preferred embodiment of the invention. First, as shown in FIG. 26, the trench-type element isolation structure 2 is formed in the main surface of the semiconductor substrate 1 and then boron ions 29 are implanted into the semiconductor substrate 1 to form a well. At this time, as in the third preferred embodiment, ion implantation is not performed for the purpose of adjusting the operation threshold voltage of the MOSFET. Subsequently, the same structure as that shown in FIG. 8 is obtained through the same processes as those in the first preferred embodiment.

Next, boron ions 32 are implanted into the semiconductor substrate 1 by an ion implantation using the silicon oxide film 5 as a mask, with an implant energy of about 50 keV and a concentration of about $1 \times 10^{12}$ to $3 \times 10^{13}/cm^2$. This locally forms the channel doping region 31 in the semiconductor substrate 1 (FIG. 29). After this, the structure shown in FIG. 28 is obtained through the same processes as those in the first preferred embodiment.

In this way, according to the MOSFET of the fourth preferred embodiment and its manufacturing method, the channel doping region 31 is locally formed in the semiconductor substrate 1 under the gate insulating film 7 and the sidewalls 6. Accordingly, similarly to the MOSFET of the third preferred embodiment, the operation speed of the MOSFET can be enhanced.

Further, in the part in which the upper part of the channel doping region 31 of a first conductivity type and the lower part of the extensions 3 of a second conductivity type overlap, the opposite conductivity types cancel out. As a result, the depth of the extensions 3 from the main surface of the semiconductor substrate 1 becomes shallower, which more effectively suppresses the short-channel effect of the MOSFET.

Fifth Preferred Embodiment

Figure 30:
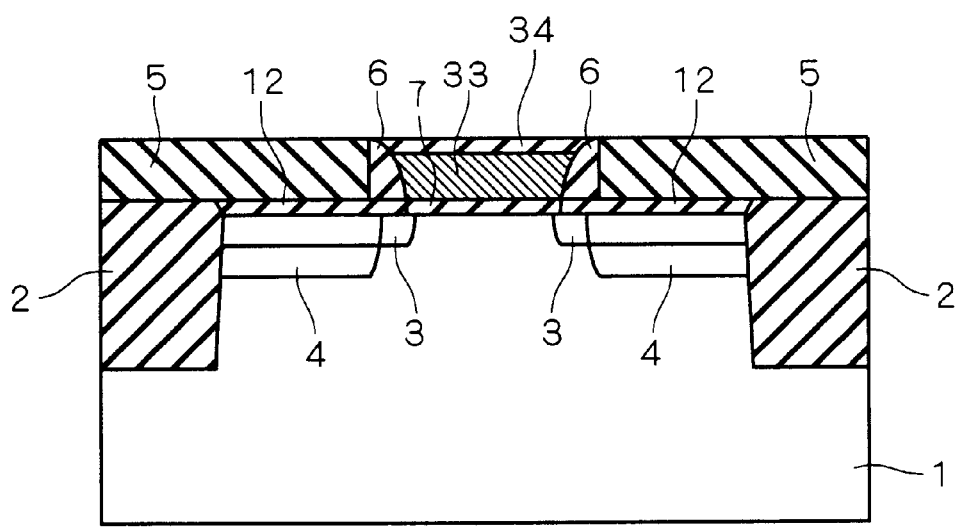
FIG. 30 is a sectional view showing the structure of an MOSFET according to a fifth preferred embodiment of the present invention.

FIG. 30 is a sectional view showing the structure of an MOSFET according to a fifth preferred embodiment of the present invention. As shown in FIG. 30, in the MOSFET of the fifth preferred embodiment, on the basis of the MOSFET of the first preferred embodiment shown in FIG. 1, a gate electrode 33 is formed in place of the gate electrode 8, with its upper surface located lower than the upper surface of the silicon oxide film 5, and a silicon nitride film 34 is formed on the upper surface of the gate electrode 33 to surround the gate electrode 33 with the sidewalls 6.

Figure 31:
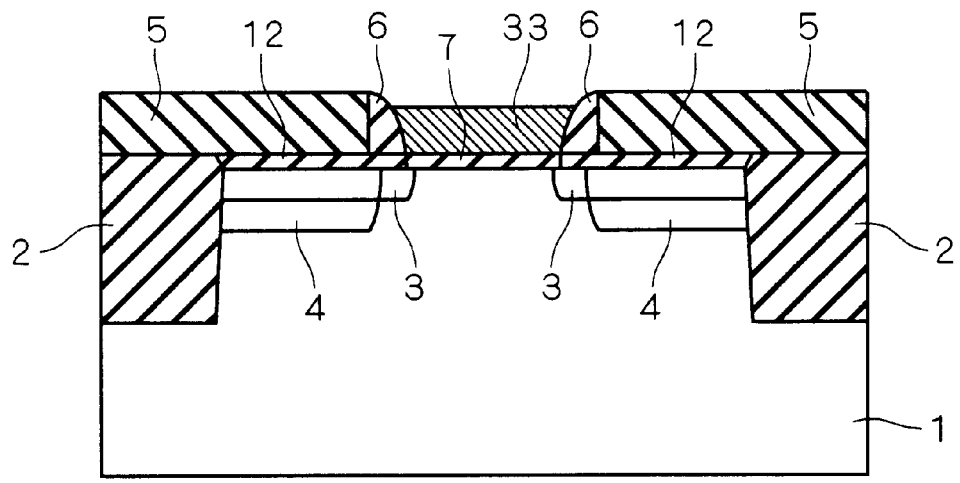
FIGS. 31 and 32 are sectional views showing a method of manufacturing the MOSFET of the fifth preferred embodiment of the invention.
Figure 32:
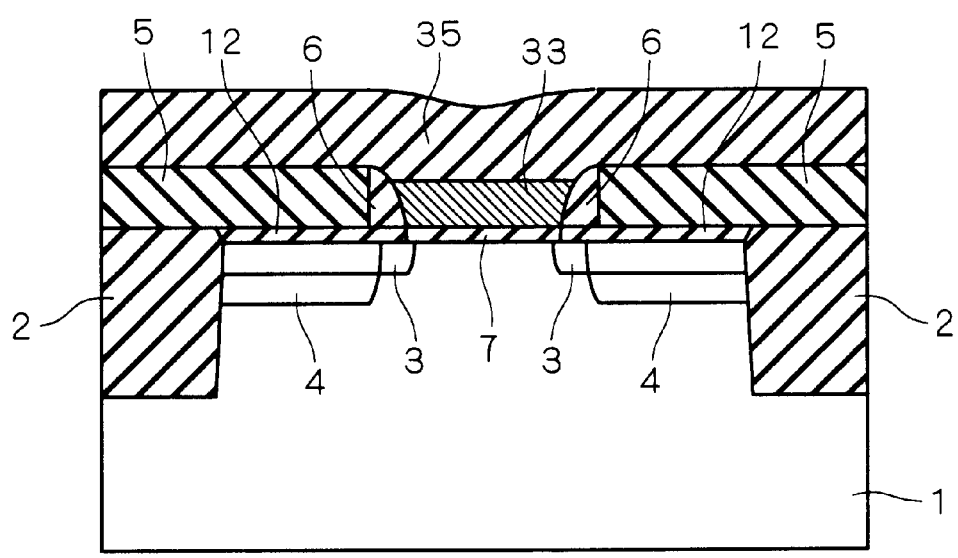

FIGS. 31 and 32 are sectional views showing, in the order of process steps, a method of manufacturing the MOSFET of the fifth preferred embodiment of the invention. First, the same structure as that shown in FIG. 14 is obtained through the same processes as those in the first preferred embodiment. Next, part of the upper portion of the gate electrode 8 is removed to form the gate electrode 33 (FIG. 31). Next, a silicon nitride film 35 having a film thickness of about 100 nm is formed by a CVD over the entire surface (FIG. 32). Next, the silicon nitride film 35 is polished away by CMP until the upper surface of the silicon oxide film 5 is exposed, and the structure shown in FIG. 30 is thus obtained.

In this way, according to the MOSFET of the fifth preferred embodiment and its manufacturing method, the gate electrode 33 is surrounded by the sidewalls 6 made of silicon nitride film and the silicon nitride film 34 formed on the upper surface of the gate electrode 33. Accordingly, the self-aligned contact formation technique can be adopted when forming a contact hole in the silicon oxide film 5 in a later process to make electric contact with the source/drain regions 4. That is to say, only the silicon oxide film can be selectively etched away by the use of a large etching selectivity between silicon oxide film and silicon nitride film, so that the contact hole and the gate electrode 33 can be prevented from coming in contact with each other.

Although the silicon nitride film 35 is removed by a CMP in the example above, the silicon nitride film 35 may be removed by an anisotropic etching. In this case, when the distance between the opposing parts of the silicon oxide film 5 is long relatively to the film thickness of the deposited silicon nitride film 35 (twice or more, for example), the silicon nitride film 35 is removed in the part over the center of the gate electrode 33. However, also in this case, the self-aligned contact formation technique can be used since the silicon nitride film 35 remains on the peripheral part of the gate electrode 33.

Sixth Preferred Embodiment

Figure 33:
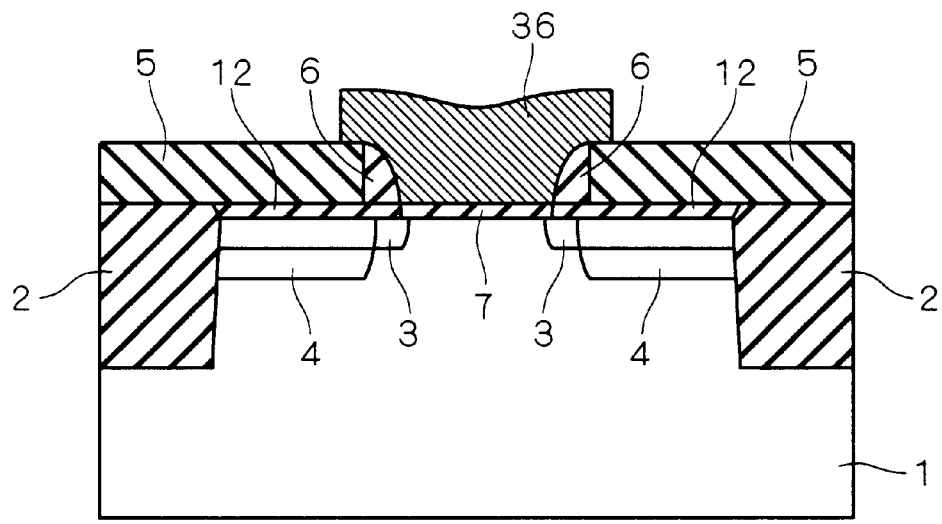
FIG. 33 is a sectional view showing the structure of an MOSFET according to a sixth preferred embodiment of the invention.

FIG. 33 is a sectional view showing the structure of an MOSFET according to a sixth preferred embodiment of the present invention. As shown in FIG. 33, on the basis of the MOSFET of the first preferred embodiment shown in FIG. 1, the MOSFET of the sixth preferred embodiment has, in place of the gate electrode 8, a gate electrode 36 having its periphery extending on the upper surface of the silicon oxide film 5.

Figure 34:
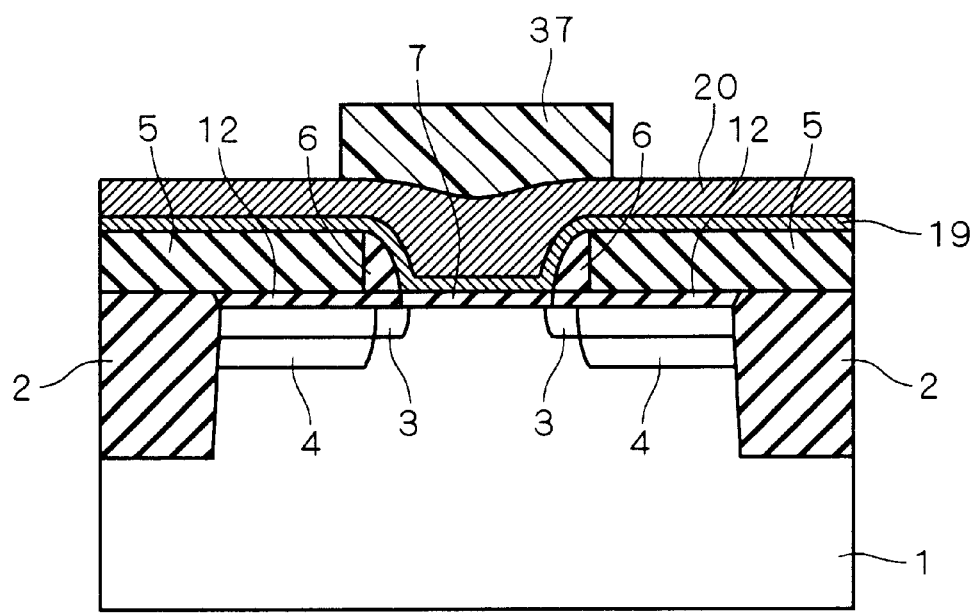
FIGS. 34 and 35 are sectional views showing a method of manufacturing the MOSFET of the sixth preferred embodiment of the invention in the order of processes.
Figure 35:
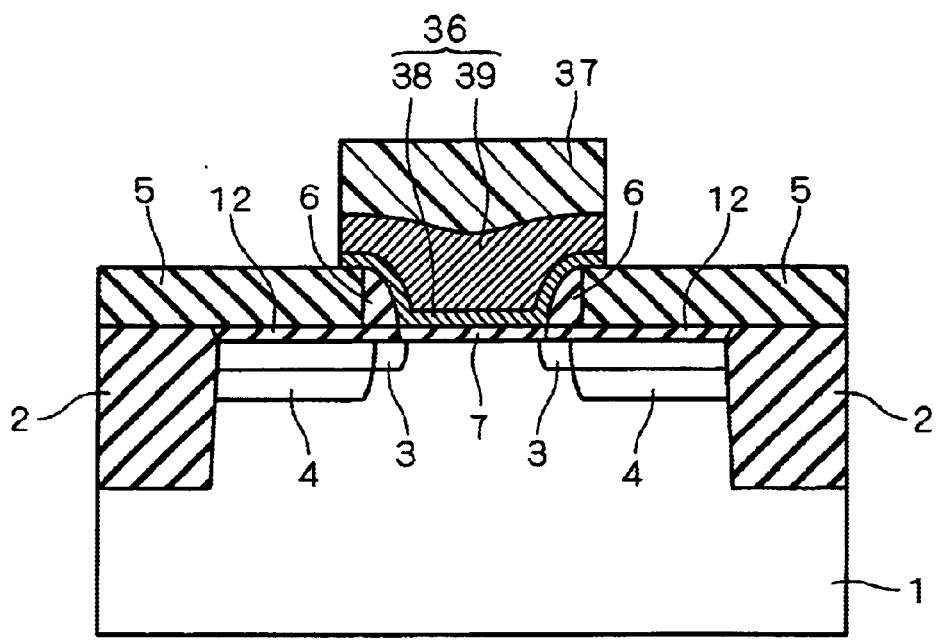
Figure 36:
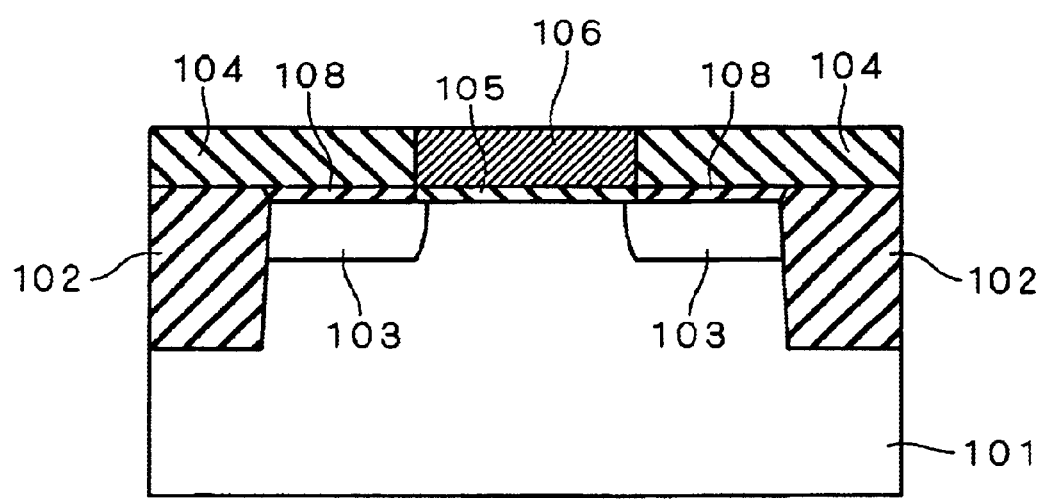
FIG. 36 is a sectional view showing a structure of a conventional MOSFET.
Figure 37:
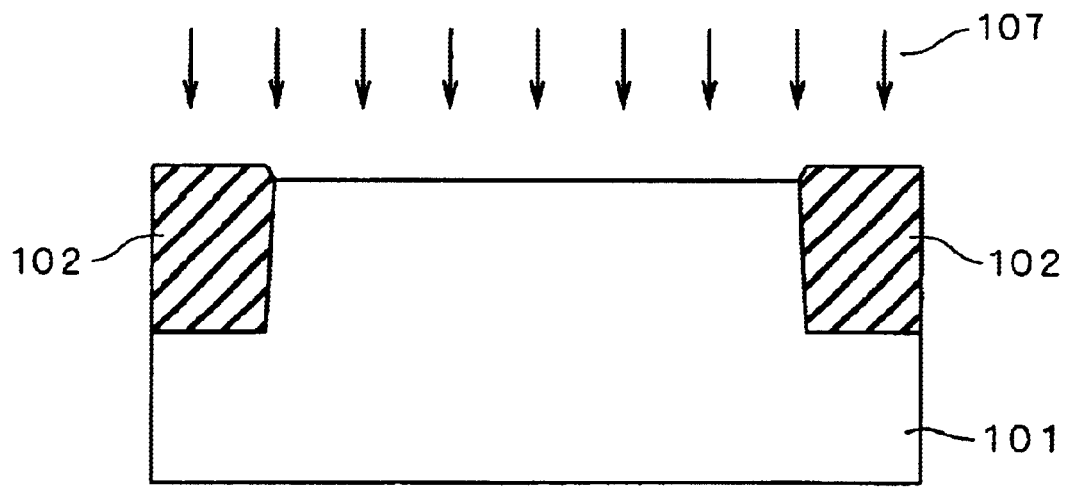
FIGS. 37 to 42 are sectional views showing a method of manufacturing the conventional MOSFET in the order of processes.
Figure 38:
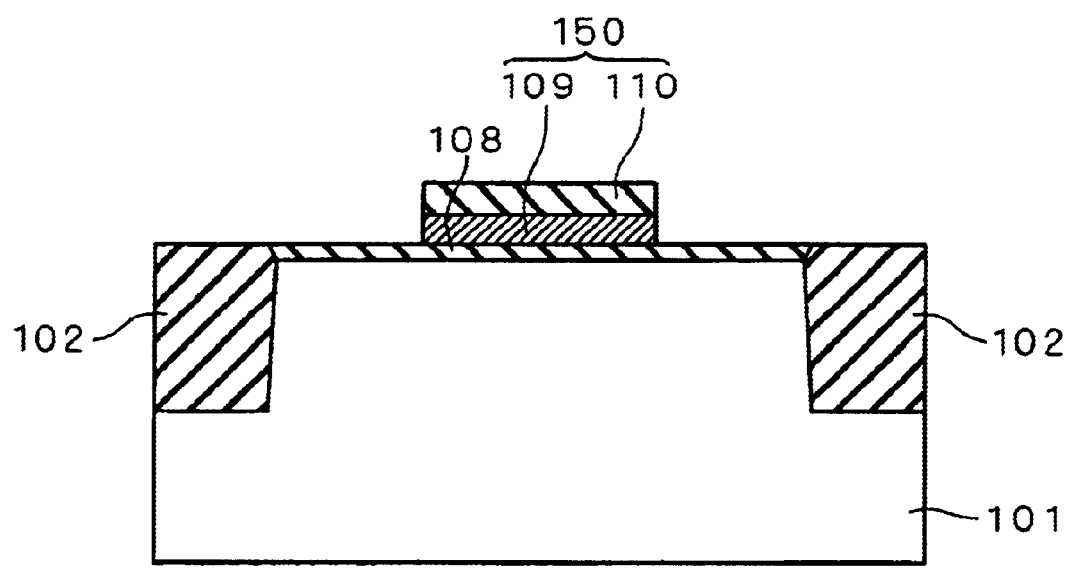
Figure 39:
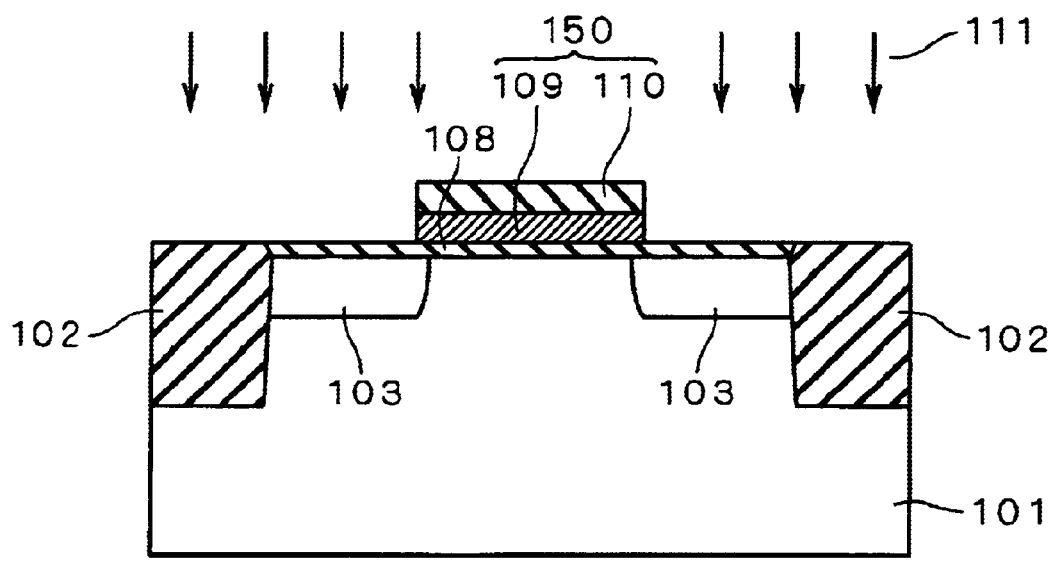
Figure 40:
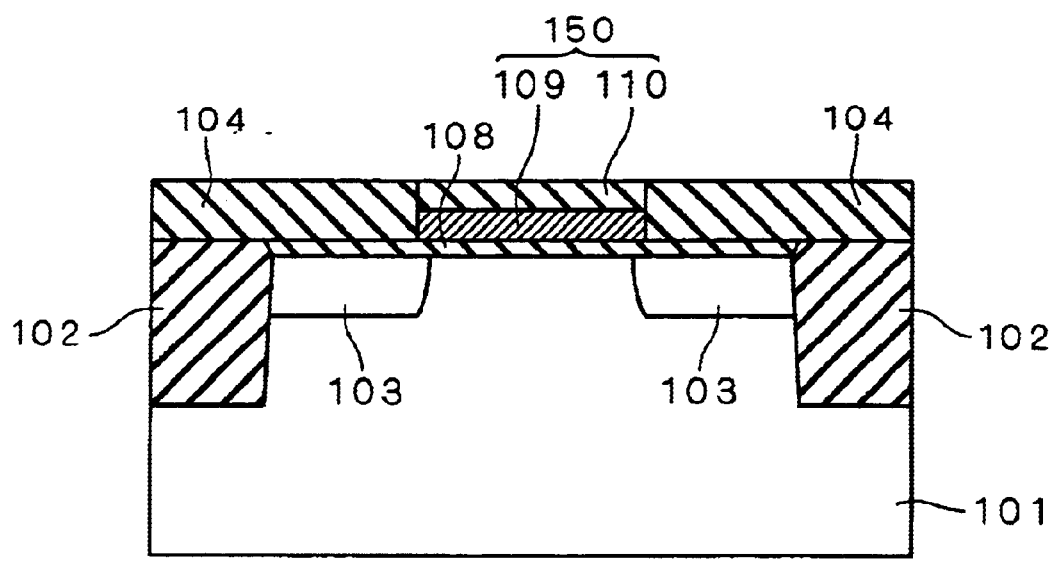
Figure 41:
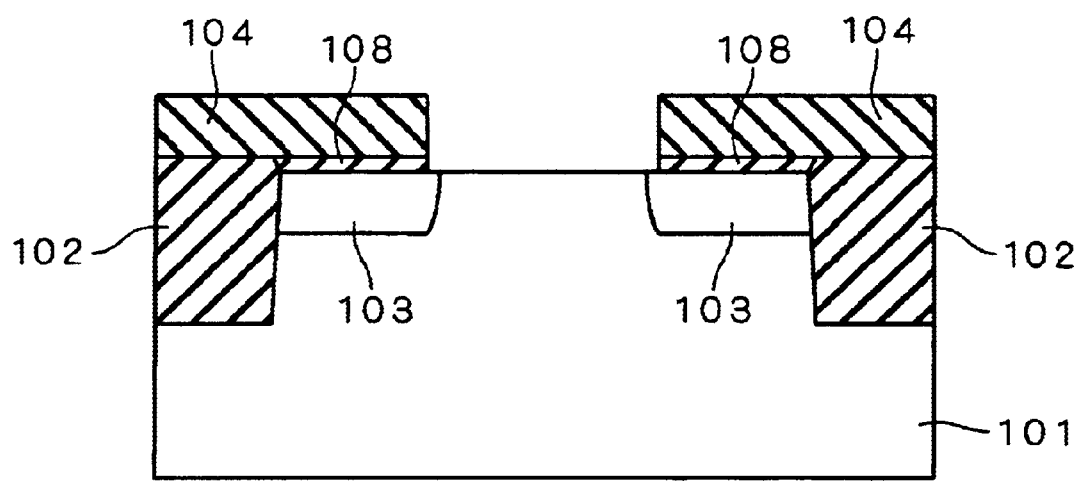
Figure 42:
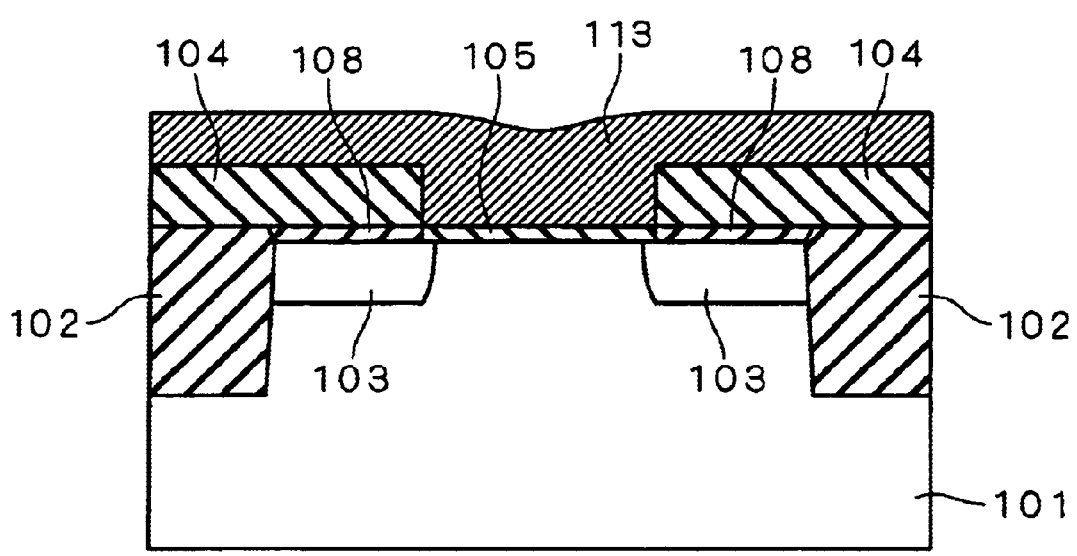
Figure 43:
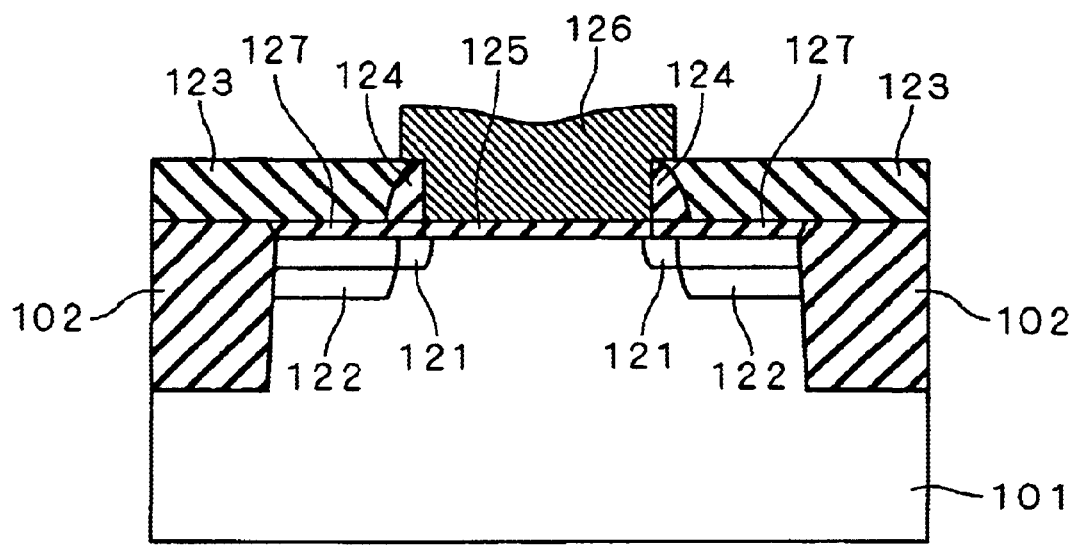
FIG. 43 is a sectional view showing another structure of a conventional MOSFET.
Figure 44:
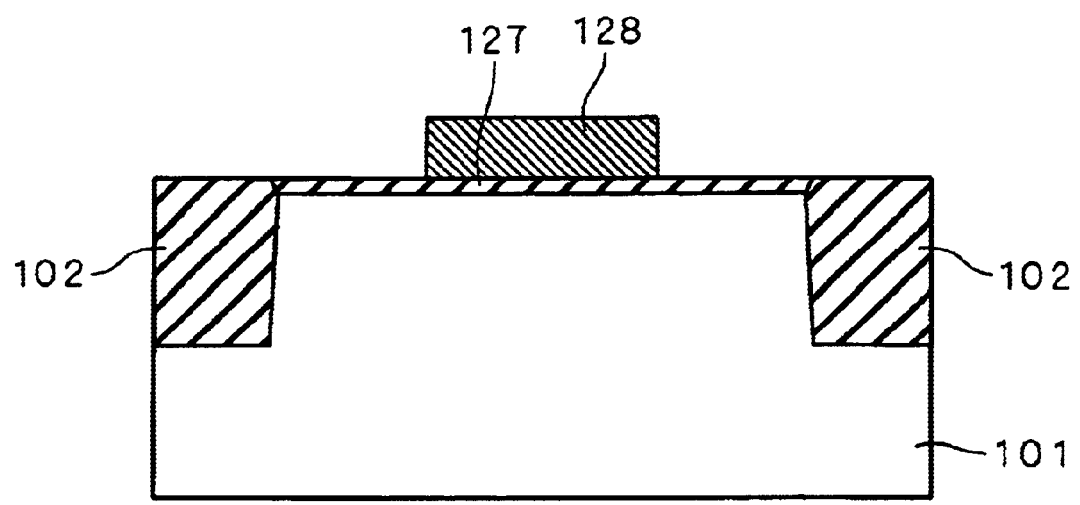
FIGS. 44 to 50 are sectional views showing another method for manufacturing the conventional MOSFET in the order of processes.
Figure 45:
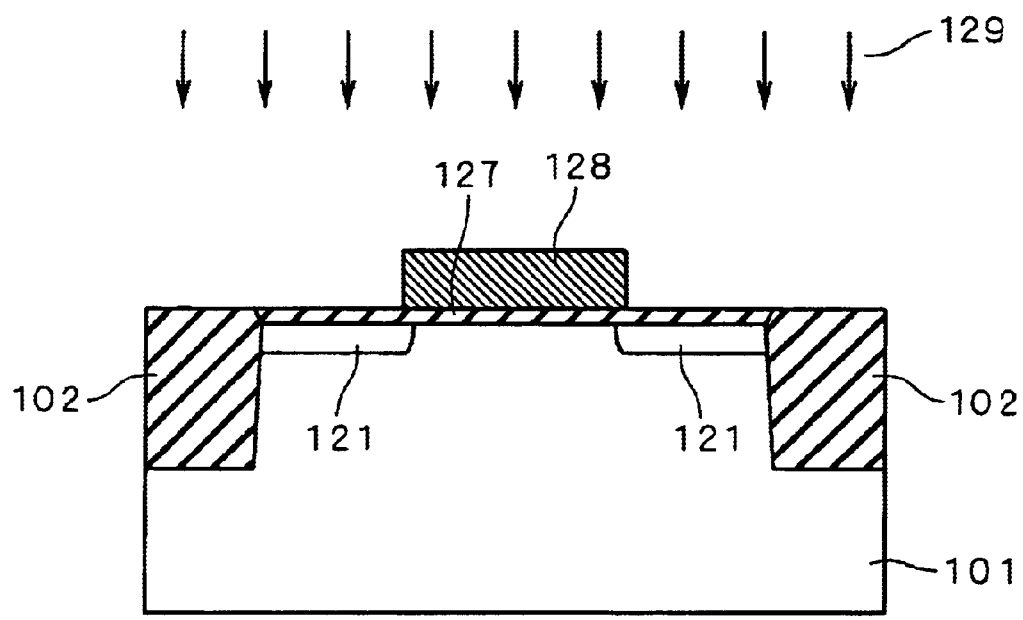
Figure 46:
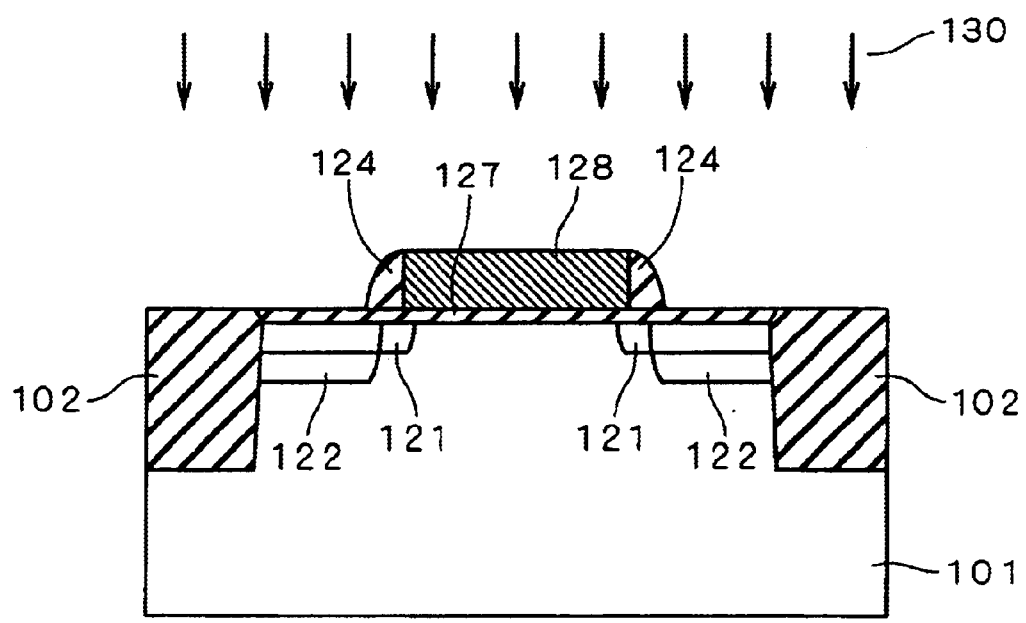
Figure 47:
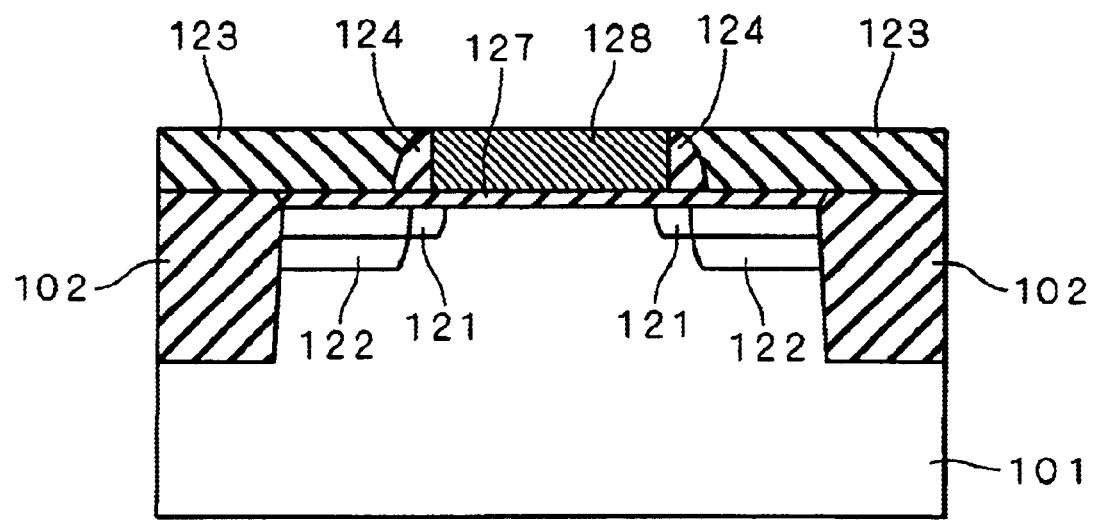
Figure 48:
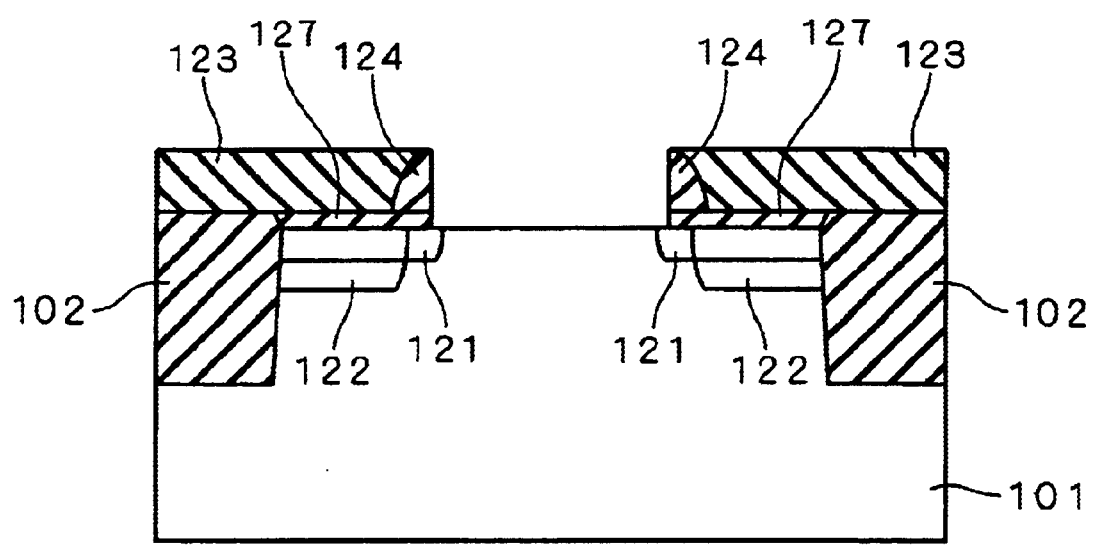
Figure 49:
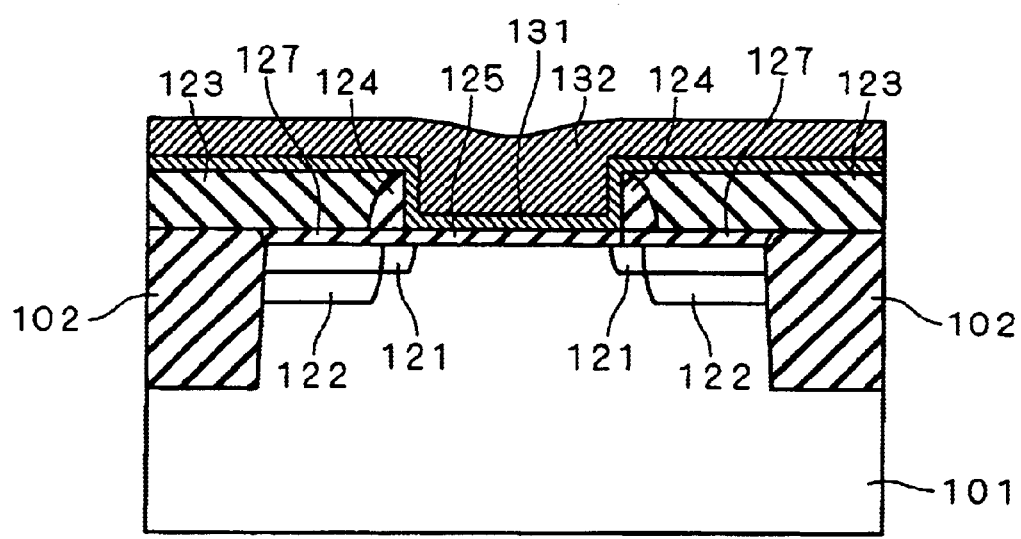
Figure 50:
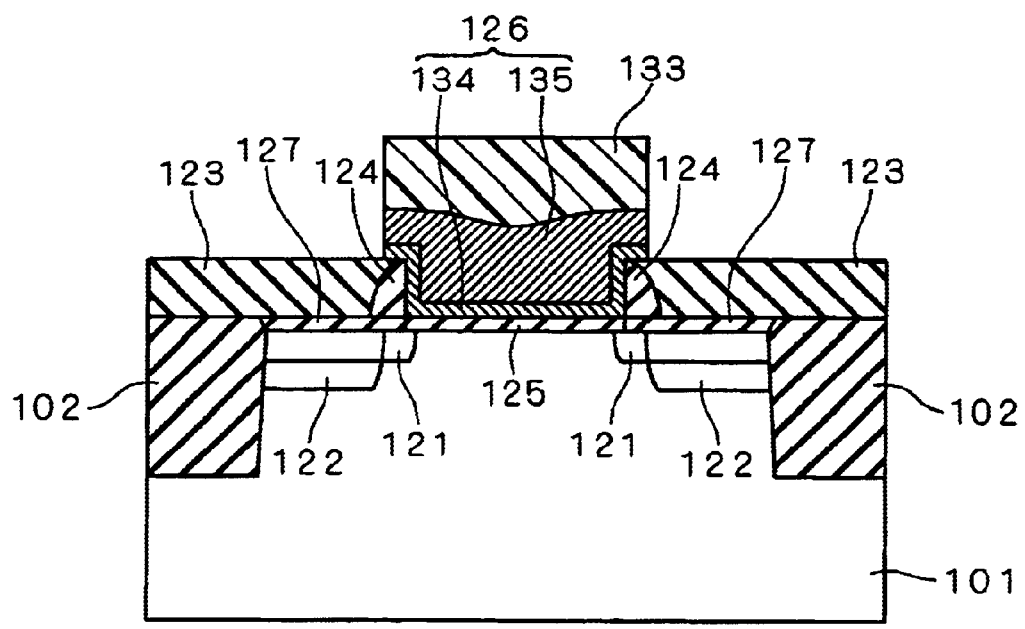

FIGS. 34 and 35 are sectional views showing a method of manufacturing the MOSFET of the sixth preferred embodiment of the invention in the order of processes. First, the same structure as that shown in FIG. 13 is obtained through the same processes as those in the first preferred embodiment. Next, a photoresist 37 having given pattern is formed by a photolithography on the tungsten film 20 (FIG. 34). As shown in FIG. 34, the side ends of the photoresist 37 extend over the silicon oxide film 5. The amount of extension of the photoresist 37 over the silicon oxide film 5 can be adjusted by varying the mask pattern of the photomask used to form the photoresist 37.

Next, the tungsten nitride film 19 and the tungsten film 20 are etched away by using an anisotropic dry etching in which the etching rate is higher in the direction of the depth of the semiconductor substrate 1, and the gate electrode 36 can thus be made with the tungsten nitride film 38 and the tungsten film 39 (FIG. 35). Next, the photoresist 37 on the tungsten nitride film 39 is removed to obtain the structure shown in FIG. 33.

In this way, according to the MOSFET of the sixth preferred embodiment and its manufacturing method, the peripheral part of the gate electrode 36 extends on the upper surface of the silicon oxide film 5. Accordingly, as compared with the MOSFETs of the first to fifth preferred embodiments, the gate length in the upper part of the gate electrode 36 can be further lengthened to further reduce the gate resistance.

Further, since CMP is not used when removing the tungsten nitride film 19 and the tungsten film 20 on the silicon oxide film 5, the manufacturing cost can be reduced. Furthermore, the silicon oxide film 5 can be used as an etching stopper in the dry etching, so that the etching can be stopped relatively easily.

While the invention has been described in detail, the foregoing description is in all aspects illustrative and not restrictive. It is understood that numerous other modifications and variations can be devised without departing from the scope of the invention.

What is claimed is:

1. A semiconductor device, comprising:

a substrate;

source/drain regions formed in a main surface of said substrate with a channel region interposed therebetween;

a first insulating film formed on said main surface of said substrate in an area in which said source/drain regions are formed;

sidewalls composed of a second insulating film and formed on sides of said first insulating film;

a gate insulating film composed of a third insulating film and formed on said main surface of said substrate in an area in which said channel region is formed;

a gate electrode formed to fill an inversely tapered recessed portion formed by sides of said sidewalls and an upper surface of said gate insulating film; and a fourth insulation film formed on an upper surface of said gate electrode and surrounding said gate electrode with said sidewalls, wherein said gate electrode is inversely tapered such that a gate length continuously gradually diminishes from a top portion to a bottom portion until the bottom reaches the gate insulation film such that the gate length at the bottom portion of the gate electrode is narrower that the gate length at the top portion of the gate electrode, wherein said third insulation film is composed of a material having a dielectric constant higher that that of said first insulating film, and is formed only on said main surface of said substrate and said sides of said sidewalls, and wherein said second and fourth insulation films are composed of a material which is different from that of said first insulation film.

2. A semiconductor device, comprising:

a substrate;

source/drain regions formed in a main surface of said substrate with a channel region interposed therebetween;

a first insulating film formed on said main surface of said substrate in an area in which said source/drain regions are formed;

sidewalls composed of a second insulating film and formed on sides of said first insulating film;

a gate insulating film composed of a third insulating film and formed on said main surface of said substrate in an area in which said channel region is formed; and a gate electrode formed to fill an inversely tapered recessed portion formed by sides of said sidewalls and an upper surface of said gate insulating film, wherein said gate electrode is inversely tapered such that a gate length continuously gradually diminishes from a top portion to a bottom portion until the bottom portion reaches the gate insulating film such that the gate length at the bottom portion of the gate electrode is narrower than the gate length at the top portion of the gate electrode, wherein said third insulating film is composed of a material having a dielectric constant higher that that of said first insulating film, and is formed only on said main surface of said substrate and said sides of said sidewalls, and wherein said gate electrode has its peripheral part formed to extend on an upper surface of said first insulating film.

* * * * *